(12) United States Patent
Kubo

(10) Patent No.: US 7,180,824 B2
(45) Date of Patent: Feb. 20, 2007

(54) SEMICONDUCTOR MEMORY DEVICE WITH A PAGE MODE

(75) Inventor: Takashi Kubo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/072,274

(22) Filed: Mar. 7, 2005

(65) Prior Publication Data

US 2005/0232068 A1    Oct. 20, 2005

(30) Foreign Application Priority Data

Mar. 30, 2004   (JP)   ............... 2004-098463

(51) Int. Cl.
*G11C 7/10*   (2006.01)
*G11C 8/18*   (2006.01)
*G11C 29/00*  (2006.01)
*G11C 7/00*   (2006.01)

(52) U.S. Cl. ............... 365/238.5; 365/233.5; 365/200; 365/189.05

(58) Field of Classification Search ............. 365/238.5
See application file for complete search history.

(56) References Cited

U.S. PATENT DOCUMENTS 5,398,213 A    3/1995   Yeon et al.

FOREIGN PATENT DOCUMENTS

JP    7-73664    3/1995
JP    11-39863   2/1999

*Primary Examiner*—Amir Zarabian
*Assistant Examiner*—Michael Weinberg
(74) *Attorney, Agent, or Firm*—McDermott Will & Emery LLP

(57) ABSTRACT

A sense amplifier and a latch for sense data output the former 4 words of sense data to a latch for page data, and during a page mode reading period of the former 4 words of data as external data by the latch for page data, a selector circuit and an output buffer, perform a sense amplifying operation and a latch operation on the latter 4 words of memory cell information output from a Y gate under control of a sense signal and a latch signal.

8 Claims, 16 Drawing Sheets

F I G . 9
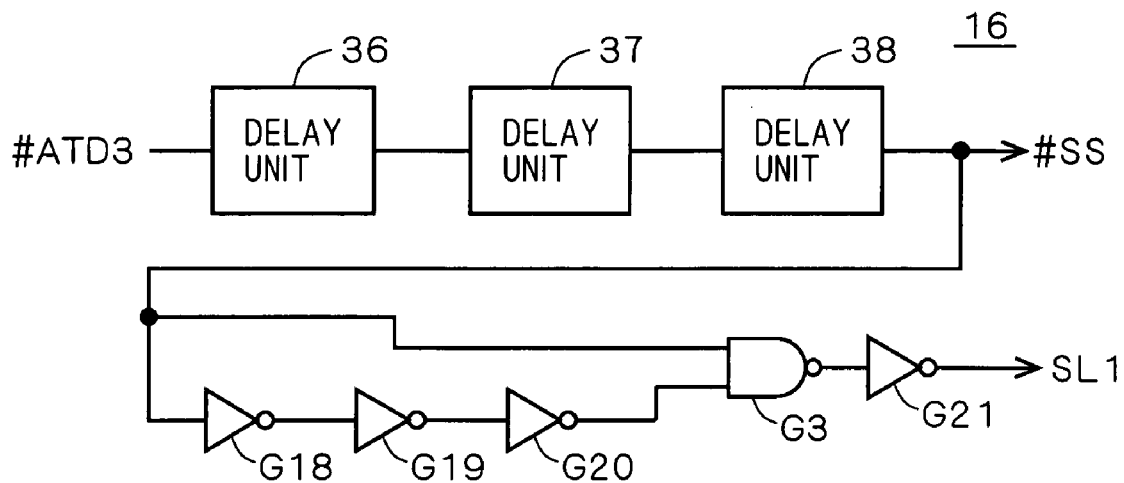
F I G . 1 0
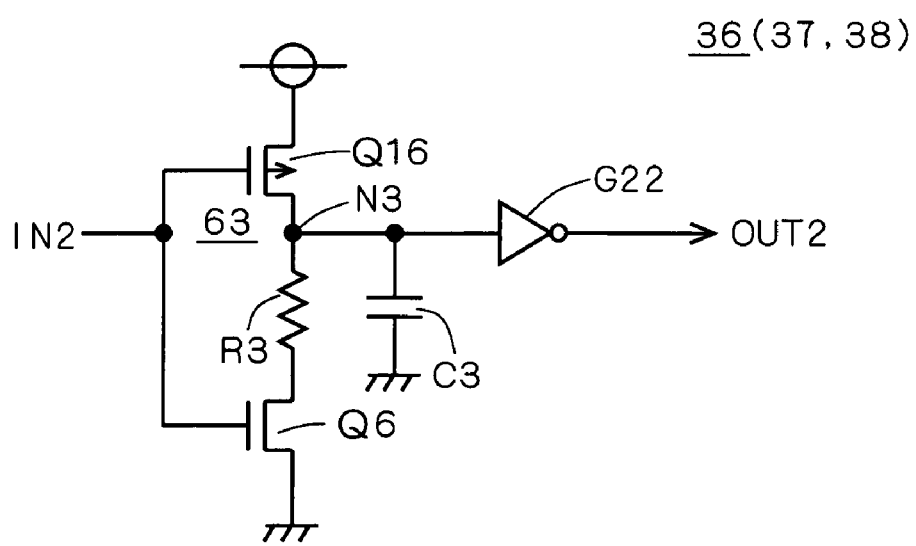

SEMICONDUCTOR MEMORY DEVICE WITH A PAGE MODE

BACKGROUND OF THE INVENTION

1. Field of the Invention

This invention relates to semiconductor memory devices having a page mode reading function.

2. Description of the Background Art

In semiconductor memory devices such as DRAMs in which memory cells per se have no logic outputting function of "H" and "L" levels, a sense amplifying operation is required in order to detect and amplify data stored in the memory cells and convert the data into logical value ("H" and "L"). As performing the sense amplifying operation on a word-by-word basis will extremely delay access to data, a page mode reading function is widely used in which data recorded in a plurality of words of memory cells are simultaneously read (including the sense amplifying operation) and temporarily stored in a latch, so that the data are accessible with read time from the latch the second and subsequent times. Semiconductor memory devices having the page mode reading function are disclosed, for example, in Japanese Patent Application Laid-Open Nos. 7-73664 (1995) and 11-39863 (1999).

When a semiconductor memory device having the page mode reading function includes 16 data output pins (of 16 bits) in response to an access request from an LSI capable of processing 16 bytes (128 bits (1 byte=8 bits)) of data at a time, for example, a page mode function of 8 words (128 bits (in terms of 1 word =16 bits)), that is, a page mode function of 8 words of page length, would allow 128 bits of data to be read by a onetime sense amplifying operation, thus achieving high-speed data transmission with the LSI. Electronic equipment that employs a semiconductor memory device having the page mode reading function includes mobile phone, for example.

However, a word length increase of page mode involves an increase in the number of simultaneously activated sense amplifiers and also an increase in memory capacity of a latch for temporarily storing data, resulting in problems such as an increase in peak current value and an increase in layout area of a transistor or wiring.

SUMMARY OF THE INVENTION

It is an object of this invention to provide a semiconductor memory device having a page mode reading function that minimizes a peak current and an increase in layout area.

In an aspect of this invention, a semiconductor memory device includes a memory cell array, a read control part, a sense amplifier, a latch for sense data, a latch for page data, a page mode control circuit, and a selector circuit.

The memory cell array includes a plurality of memory cells which are provided correspondingly to an address signal that consists of higher order and low order address signals designated by the first and second bit numbers; the read control part reads a prescribed number of memory cell information from the memory cell array based on the high order address signal; the sense amplifier performs a sense amplifying operation on each of the prescribed number of memory cell information to obtain a prescribed bit number of sense data; the latch for sense data latches the prescribed bit number of sense data at timing indicated by a first latch signal; the latch for page data latches the prescribed bit number of sense data stored in the latch for sense data as page data at timing indicated by a second latch signal, the page data being classifiable under n partial page data correspondingly to the low order address signal; the page mode control circuit outputs the first and second latch signals; and the selector circuit outputs the n partial page data as page selection data sequentially based on the low order address signal that changes n times during a page mode reading period, the page selection data being output as external data.

After a first memory cell information group which is the prescribed number of memory cell information read from the memory cell array based on the high order address signal that defines a first address is latched into the latch for page data as the page data via the sense amplifier and the latch for sense data, the page mode control circuit performs a bit reversal process for reversing prescribed bits in the first address defined by the high order address signal to generate a second address successive to the first address; during the page mode reading period based on the first memory cell information group, the page mode control circuit stores a second memory cell information group which is the prescribed number of memory cell information read from the memory cell array based on the high order address signal that defines the second address in the latch for sense data as the prescribed bit number of sense data via the sense amplifier; and after the page mode reading period based on the first memory cell information group has elapsed, the page mode control circuit latches the prescribed bit number of sense data based on the second memory cell information group stored in the latch for sense data into the latch for page data as the page data, thereby setting a page mode reading period based on the second memory cell information group after the page mode reading period based on the first memory cell information group.

As page mode readings based on the first and second memory cell information groups can be performed sequentially, a word length which is the number the page selection data can read sequentially is doubled with respect to the ability required for the sense amplifier, the latch for sense data and the latch for page data.

Therefore, a semiconductor memory device that minimizes a peak current at the time of page mode reading and an increase in layout area of a circuit that achieves the page mode reading function is obtained.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a circuit diagram showing the internal structure of a sense control circuit shown in FIG. 4;

FIG. 10 is a circuit diagram showing the internal structure of a delay unit shown in FIG. 9;

DESCRIPTION OF THE PREFERRED EMBODIMENTS

<Principle>

In a semiconductor memory device having the page mode reading function of a prescribed page length, a page mode of a substantial page length being several times as long (hereinafter referred to as "sequential page mode") would be attained by sequentially operating the page mode reading function multiple times, which would ensure high-speed data transmission while suppressing the above-mentioned problems including the increase in peak current value and the increase in layout area. However, this has conventionally been far from a reality due to extremely complicated operations required for automatically keeping the page mode reading function inside during a page mode reading operation that essentially operates asynchronously with an access request from outside. Especially hard to attain is consistency with redundant data. This invention has been made for the purpose of solving such problem.

This invention is applicable not only to volatile semiconductor memory devices such as DRAMs but also to non-volatile semiconductor memory devices. For example, this invention is applicable to a page mode reading operation in a flash memory formed by a memory cell transistor having a control gate and a floating gate. That is, this invention is particularly effective in a structure such as a flash memory, in which a prescribed number of sense amplifiers of about 4 words or 8 words are provided with respect to a prescribed number of bit lines selected among a plurality of bit lines by Y gate.

<First Preferred Embodiment>

Figure 1:
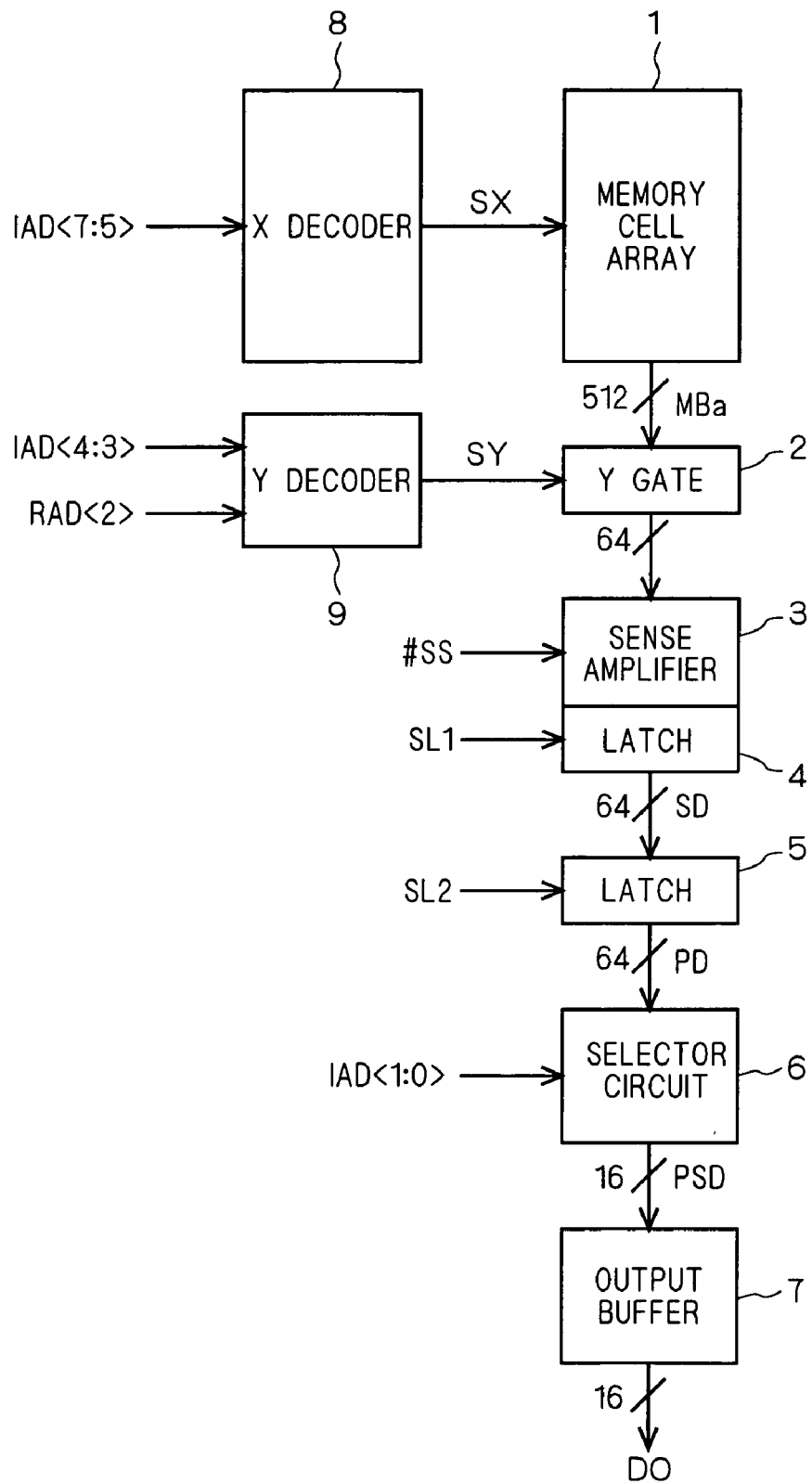
FIG. 1 is a block diagram showing the structure of the peripheral part of a memory cell array in a semiconductor memory device according to a first preferred embodiment of this invention.

FIG. 1 is a block diagram showing the structure of the peripheral part of a memory cell array in a semiconductor memory device according to a first preferred embodiment of this invention. FIG. 1 illustrates the case of 4 word pages in which an X selection signal SX is selected by an internal address IAD <7:5>, a Y selection signal SY is selected by an internal address IAD <4:3> and a reversal process address RAD <2>, 64 bits of sense data SD is output, and 2 bits of internal address IAD <1:0> is used as a page address.

A memory cell array 1 includes a plurality of memory cells arranged in a matrix, and reads memory data from memory cells selected among the plurality of memory cells based on the X selection signal SX onto a total of 512 main bit lines MBa respectively.

A Y gate 2 selects and electrically connects 64 lines (prescribed number) among the 512 main bit lines MBa to a sense amplifier 3 based on the Y selection signal SY.

That is, 64 (prescribed number) memory cell information in the memory cell array 1 are read into the sense amplifier 3 by a high order address signal including the internal address IAD <7:3> and the reversal process address RAD <2>. The reversal process address RAD <2> is prescribed target bits for reversal in high order address.

The sense amplifier 3 enters an active state when a sense signal #SS is "L" to perform a sense amplifying operation by detecting and amplifying the memory data that appear on the 64 main bit lines MBa selected by the Y gate 2 thus obtaining 64 bits (prescribed bit number) of sense data SD.

A latch 4 for sense data enters an active state when a latch signal SL1 is "H" to latch the 64 bits of sense data SD obtained by the sense amplifier 3, and holds the latched sense data SD afterwards until the latch signal SL1 becomes "H" again. Thus, the sense data SD latched into the latch 4 for sense data is held even when the sense amplifier 3 enters an inactive state.

A latch 5 for page data enters an active state when a latch signal SL2 is "H" to latch the sense data SD stored in the latch 4 for sense data as page data PD. The page data PD is classifiable under four 1 word of partial page data, correspondingly to an internal address IAD <1:0> which is a low order address.

A selector circuit 6 outputs one partial page data among the 64 bits of page data PD (four partial page data) as 1 word (16 bits) of page selection data PSD based on an address selected by the internal address IAD <1:0>. In short, conventional-level hardware structure formed by the sense amplifier 3, the latch 4 for sense data, the latch 5 for page data, and the selector circuit 6 has a page mode reading function of 4 words of page length.

An output buffer 7 buffers and outputs the page selection data PSD as external data DO.

An X decoder 8 outputs the X selection signal SX based on the internal address IAD <7:5>, and a Y decoder 9 outputs the Y selection signal SY based on the internal address <4:3> and the reversal process address RAD <2>.

Thus, the Y gate 2, the X decoder 8, and the Y decoder 9 form a read control part for reading the 64 bits of memory cell information from the memory cell array 1.

Figure 2:
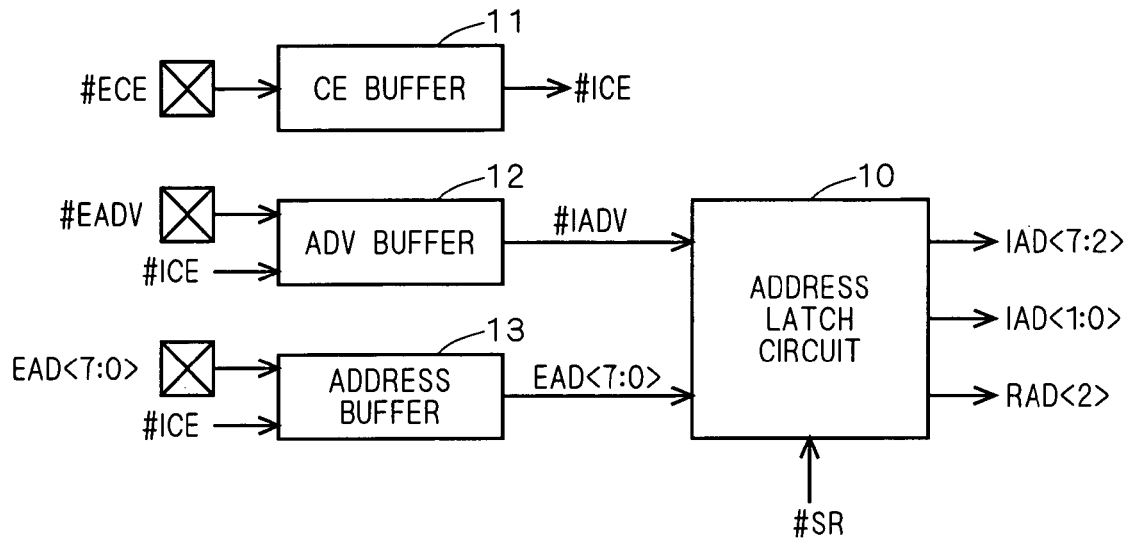
FIG. 2 is a block diagram showing the structure of an internal address supply section in the first preferred embodiment.

FIG. 2 is a block diagram showing the structure of an internal address supply section for supplying an internal address including the internal address IAD <7:5>, the internal address IAD <4:3>, and the reversal process address RAD <2>.

As shown, a CE buffer 11 buffers an external chip enable signal #ECE to output an internal chip enable signal #ICE. An ADV buffer 12 buffers an external address valid signal #EADV and the internal chip enable signal #ICE to output an internal address valid signal #IADV. An address buffer 13 buffers an external address EAD <7:0> and the internal chip enable signal #ICE to output the external address EAD <7:0> to an address latch circuit 10.

The address latch circuit 10 receives the internal address valid signal #IADV, the external address EAD <7:0>, and the internal chip enable signal #ICE, and when the external address valid signal #EADV and the internal chip enable signal #ICE are "L", outputs the internal address IAD <7:2>, the internal address IAD <1:0>, and the reversal process address RAD <2> based on the external address EAD <7:0> and a reversal indication signal #SR.

Figure 3:
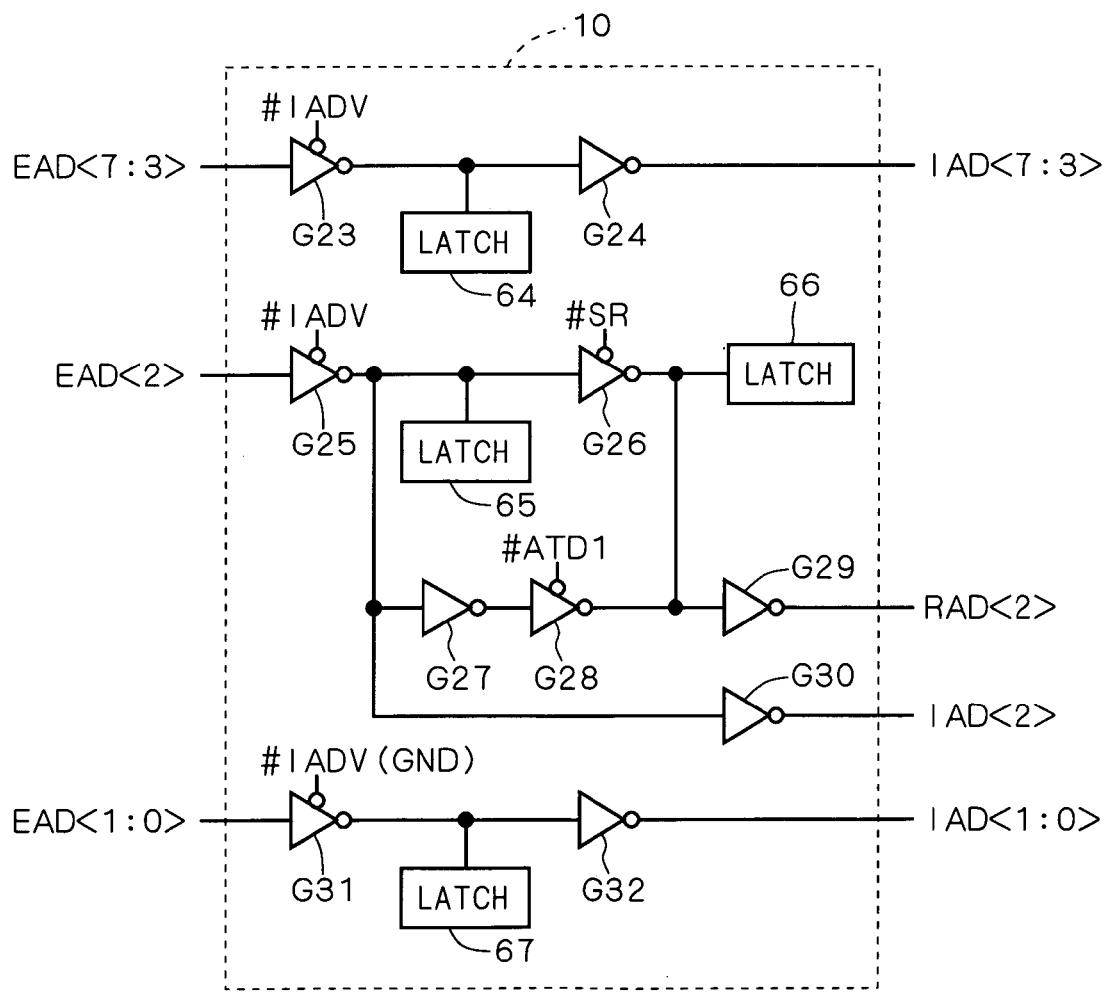
FIG. 3 is a circuit diagram showing the internal structure of an address latch circuit shown in FIG. 2.

FIG. 3 is a circuit diagram showing the internal structure of the address latch circuit 10. As shown, an inverter G23 receives the external address EAD <7:3>, and an inverter G24 has an input connected to the output of the inverter G23 and a latch 64, and outputs the internal address IAD <7:3>. The inverter G23 receives the internal address valid signal #IADV as a control input, and when the signal #IADV is "L", enters an active state.

Note that since the external address EAD <7:3> contains 5 bits, there are actually a total of five inverters G23, five inverters G24, and five latches 64 provided correspondingly to each address signal (of 1 bit) of the external address EAD <7:3>. For convenience' sake, structures for simultaneously receiving a plurality of bits of signal such as the external address EAD <7:3> that are identical to one another in each bit may be illustrated as 1 bit of structure in this specification.

An inverter G31 receives the external address EAD <1:0>, and an inverter G32 has an input connected to the output of the inverter G31 and a latch 67, and outputs the internal address IAD <1:0>. The inverter G31 receives the internal address valid signal #IADV as a control input, and when the signal #IADV is "L", enters an active state.

The inputs of inverters G25, G27 and G30 simultaneously receive the external address EAD <2> which is target bits for reversal. An inverter G26 has an input connected to the output of the inverter G25 and a latch 65, and an output connected to a latch 66 and the input of an inverter G29. The inverters G27 to G29 are connected in series, and the inverter G29 has an input connected to the output of the inverter G26 and also to the latch 66. The inverter G29 outputs the reversal process address RAD <2>, and the inverter G30 outputs the internal address IAD <2>.

The address latch circuit 10 having this structure outputs the external address EAD <7:3> and external address EAD <1:0> as the internal address IAD <7:3> and internal address IAD <1:0> when the internal address valid signal #IADV is "L".

The address latch circuit 10 also outputs the external address EAD <2> as the reversal process address RAD <2> with an address transition detection signal #ATD1 falling to "L" as a trigger, and outputs a reverse signal of the external address EAD <2> as the reversal process address RAD <2> with the reversal indication signal #SR falling to "L" as a trigger.

Figure 4:
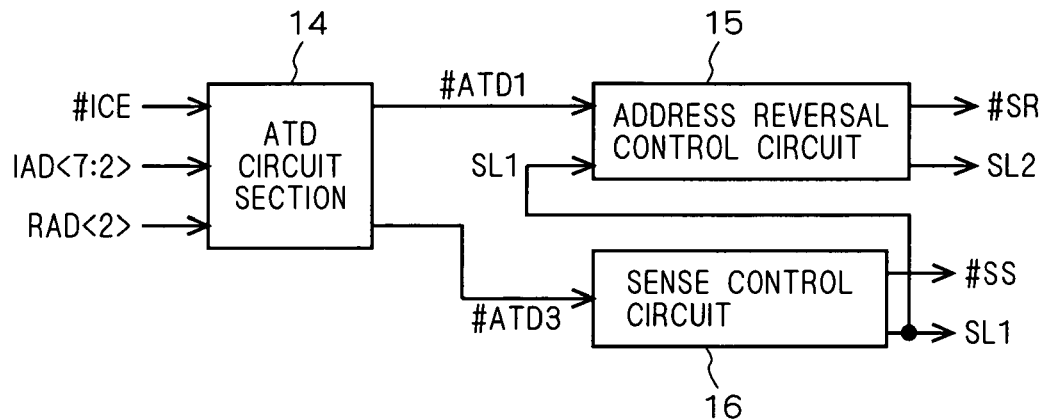
FIG. 4 is a circuit diagram showing the principal part structure of a page mode control circuit.

FIG. 4 is a circuit diagram showing the principal part structure of a page mode control circuit for outputting all kinds of control signals to the peripheral part of the memory cell array 1 shown in FIG. 1. As shown, an ATD circuit section 14 (address transition detection section) receives the internal chip enable signal #ICE, the internal address IAD <7:2>, and the reversal process address RAD <2>, to output address transition detection signals #ATD1 and #ATD3.

Figure 5:
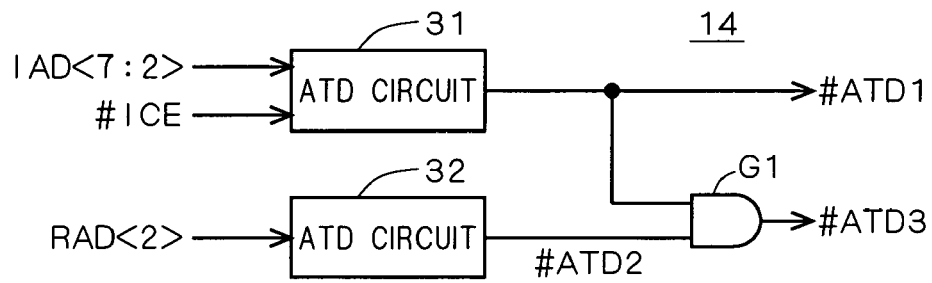
FIG. 5 is a circuit diagram showing the internal structure of an ATD circuit section shown in FIG. 4.

FIG. 5 is a circuit diagram showing the internal structure of the ATD circuit section 14. As shown, an ATD circuit 31 receives the internal address IAD <7:2> and the internal chip enable signal #ICE to output the address transition detection signal #ATD1, and an ATD circuit 32 receives the reversal process address RAD <2> to output an address transition detection signal #ATD2. An AND gate G1 receives the address transition detection signals #ATD1 and #ATD2 to output the address transition detection signal #ATD3.

Figure 6:
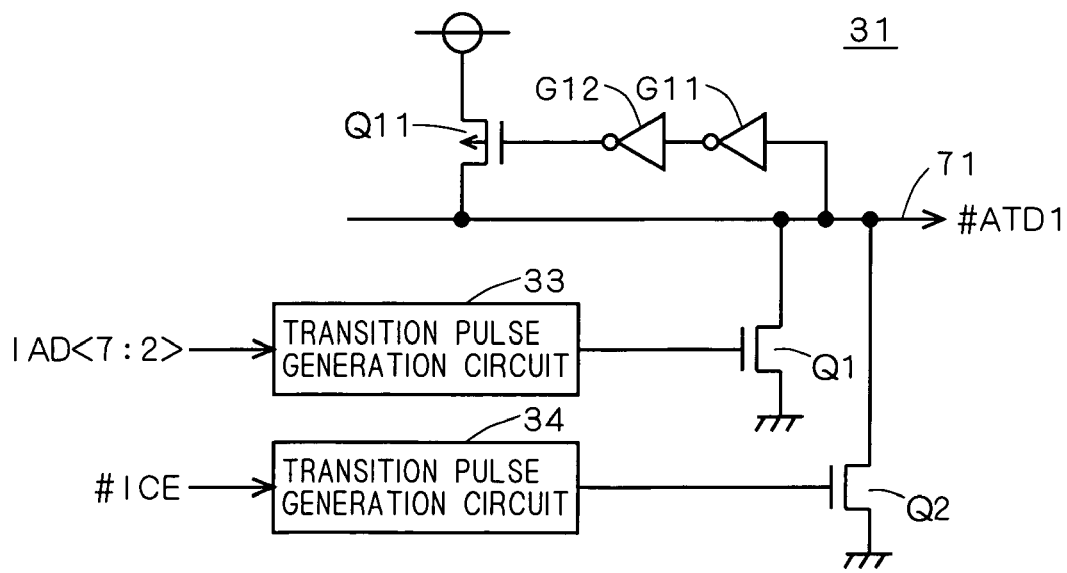
FIG. 6 is a circuit diagram showing the internal structure of an ATD circuit section (first) shown in FIG. 5.

FIG. 6 is a circuit diagram showing the internal structure of the ATD circuit 31. As shown, a transition pulse generation circuit 33 receives the internal address IAD <7:2> and upon detecting any transition of the internal address IAD <7:2>, generates transition pulses of "H". A transition pulse generation circuit 34 receives the internal chip enable signal #ICE and upon detecting an edge change in the signal #ICE, generates transition pulses of "H".

NMOS transistors Q1 and Q2 are both interposed between a signal line 71 and a ground level. The NMOS transistor Q1 has a gate connected to the output of the transition pulse generation circuit 33, and the NMOS transistor Q2 has a gate connected to the output of the transition pulse generation circuit 34.

An inverter G11 which is connected in series to an inverter G12 has an input connected to the signal line 71. A PMOS transistor Q11 is interposed between the signal line 71 and a power supply Vdd, and has a gate connected to the output of the inverter G12. The address transition detection signal #ATD1 is obtained from the signal line 71. Note that there are actually six transition pulse generation circuits 33 and six NMOS transistors Q1 provided correspondingly to each bit of the internal address IAD <7:2>.

Figure 7:
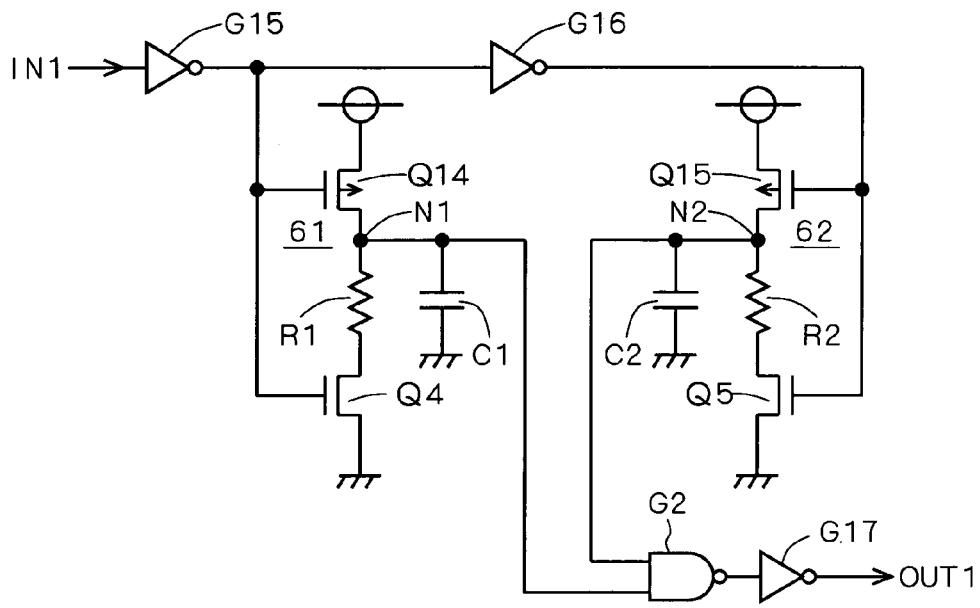
FIG. 7 is a circuit diagram showing the internal structure of a transition pulse generation circuit.

FIG. 7 is a circuit diagram showing the internal structure of a transition pulse generation circuit equivalent to the transition pulse generation circuits 33 and 34. As the circuit 33, this structure of 1 bit receives each address bit of the internal address IAD <7:2> as an input signal IN1 to output an output signal OUT1, while as the circuit 34, this structure receives the internal chip enable signal #ICE as the input signal IN1 to output the output signal OUT1.

As shown, the input of an inverter G15 which is connected in series to an inverter G16 receives the input signal IN1. In an L output delay inverter 61 formed by an NMOS transistor Q4, a PMOS transistor Q14, a resistor R1, and a capacitor C1, the PMOS transistor Q14 has a source connected to the power supply Vdd and a drain (node N1) connected to one end of the resistor R1 and one electrode of the capacitor C1. The other end of the resistor R1 is connected to the drain of the NMOS transistor Q4, and the source of the NMOS transistor Q4 and the other electrode of the capacitor C1 are grounded. The output of the inverter G15 is connected to both gates of the PMOS transistor Q14 and the NMOS transistor Q4.

In an L output delay inverter 62 formed by an NMOS transistor Q5, a PMOS transistor Q15, a resistor R2, and a capacitor C2, the PMOS transistor Q15 has a source connected to the power supply Vdd and a drain (node N2) connected to one end of the resistor R2 and one electrode of the capacitor C2. The other end of the resistor R2 is connected to the drain of the NMOS transistor Q5, and the source of the NMOS transistor Q5 and the other electrode of the capacitor C2 are grounded. The output of the inverter G16 is connected to both gates of the PMOS transistor Q15 and the NMOS transistor Q5.

The L output delay inverter 61 outputs, when the input (output of the inverter G15) rises to "H", a reverse delay signal of "L" with delay time determined by a first RC time constant of the resistor R1 and the capacitor C1 as compared with when the input falls to "L". The L output delay inverter 62 outputs, when the input (output of the inverter G16) rises to "H", a reverse delay signal of "L" with delay time determined by a second RC time constant of the resistor R2 and the capacitor C2 as compared with when the input falls to "L".

A NAND gate G2 has one and the other inputs for receiving the nodes N1 and N2 respectively, and an output connected to the input of an inverter G17. The inverter G17 outputs the output signal OUT1.

In the transition pulse generation circuit having this structure, the output of either of the L output delay inverters 61 and 62 is always "L", so the output signal OUT1 is usually "L".

And when the input signal IN1 rises to "H", the output of the L output delay inverter 62 changes from "H" to "L" with delay time corresponding to the second RC time constant as compared with a change from "L" to "H" of the output of the L output delay inverter 61, so that "H" pulses are generated from the output signal OUT1 correspondingly to the second RC time constant.

Likewise, when the input signal IN1 falls to "L", the output of the L output delay inverter 61 changes from "H" to "L" with delay time corresponding to the first RC time constant as compared with a change from "L" to "H" of the output of the L output delay inverter 62, so that "H" pulses are generated from the output signal OUT1 correspondingly to the first RC time constant.

In this manner, the transition pulse generation circuit outputs the output signal OUT1 that generates "H" pulses at the time of transition to "H" or to "L" of the input signal IN1.

Referring back to FIG. 6, the ATD circuit 31 having the above structure usually outputs the address transition detection signal #ATD1 of "H" because the signal line 71 is set to "H" by the PMOS transistor Q11. The address transition detection signal #ATD1 falls to "L" for a specified amount of time, as the NMOS transistor Q1 is turned on during the generation of "H" transition pulses from the transition pulse generation circuit 33 at the time of transition of the internal address <7:2>. Likewise, the address transition detection signal #ATD1 falls to "L" for a specified amount of time, as the NMOS transistor Q2 is turned on during the generation of "H" transition pulses from the transition pulse generation circuit 34 at the time of transition of the internal chip enable signal #ICE.

Figure 8:
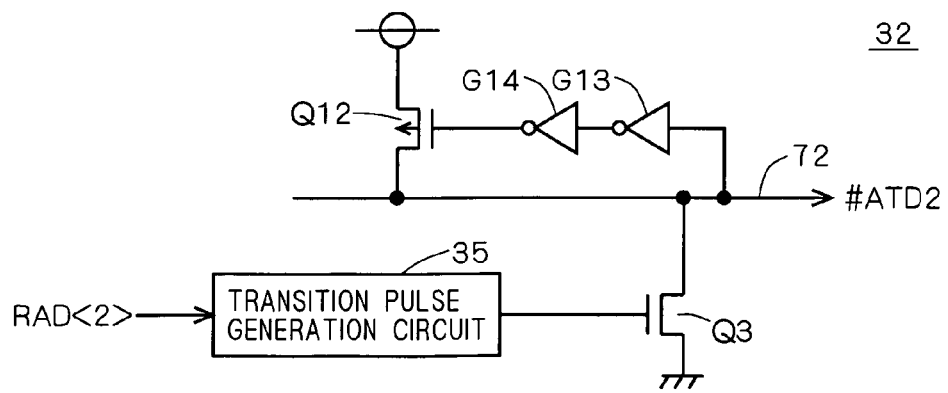
FIG. 8 is a circuit diagram showing the internal structure of an ATD circuit section (second) shown in FIG. 5.

FIG. 8 is a circuit diagram showing the internal structure of the ATD circuit 32. As shown, a transition pulse generation circuit 35 receives the reversal process address RAD <2> and, upon detecting a transition of the RAD <2>, generates transition pulses of "H".

An NMOS transistor Q3 is interposed between a signal line 72 and a ground level, and has a gate connected to the output of the transition pulse generation circuit 35.

An inverter G13 which is connected in series to an inverter G14 has an input connected to the signal line 72. A PMOS transistor Q12 is interposed between the signal line 72 and the power supply Vdd, and has a gate connected to the output of the inverter G14. The address transition detection signal #ATD2 is obtained from the signal line 72.

The transition pulse generation circuit 35 exhibits the FIG. 7 structure, and receives the reversal process address RAD <2> as the input signal IN1 to output the output signal OUT1.

The ATD circuit 32 having this structure usually outputs the address transition detection signal #ATD2 of "H" because the signal line 72 is set to "H" by the PMOS transistor Q12. The address transition detection signal #ATD2 falls to "L" for a specified amount of time, as the NMOS transistor Q3 is turned on during the generation of "H" transition pulses from the transition pulse generation circuit 35 at the time of transition of the reversal process address RAD <2>.

Referring back to FIG. 5, the ATD circuit section 14 including the above-described ATD circuits 31, 32 and the AND gate G1 outputs the address transition detection signal #ATD1 that generates "L" pulses at the time of transition of the internal address IAD <7:2> or the internal chip enable signal #ICE, and outputs the address transition detection signal #ATD3 that generates "L" pulses at the time of transition of the internal address IAD <7:2>, the internal chip enable signal #ICE, or the reversal process address RAD <2>.

Referring further back to FIG. 4, an address reversal control circuit 15 (second signal control circuit) outputs the reversal indication signal #SR and the latch signal SL2 based on the address transition detection signal #ATD1 and the latch signal SL1. A sense control circuit 16 (first signal control circuit) outputs the sense signal #SS and the latch signal SL1 based on the address transition detection signal #ATD3.

FIG. 9 is a circuit diagram showing the internal structure of the sense control circuit 16. As shown, among delay units 36 to 38 connected in three-stage series, the unit 36 in the first stage receives the address transition detection signal #ATD3, and the unit 38 in the last stage outputs the sense signal #SS. Among inverters G18 to G20 connected in three-stage series, the inverter G18 in the first stage receives the sense signal #SS. A NAND gate G3 has one input for receiving the sense signal #SS and the other input for receiving the output of the inverter G20, and outputs the latch signal SL1 via an inverter G21.

FIG. 10 is a circuit diagram showing the internal structure of the delay unit 36 (37, 38). As shown, in an L output delay inverter 63 formed by an NMOS transistor Q6, a PMOS transistor Q16, a resistor R3, and a capacitor C3, the PMOS transistor Q16 has a source connected to the power supply Vdd and a drain (node N3) connected to one end of the resistor R3 and one electrode of the capacitor C3. The other end of the resistor R3 is connected to the drain of the NMOS transistor Q6, and the source of the NMOS transistor Q6 and the other electrode of the capacitor C3 are grounded. The input of an inverter G22 is connected to the node N3.

An input signal IN2 is connected to both gates of the PMOS transistor Q16 and the NMOS transistor Q6, and the inverter G22 outputs an output signal OUT2. In the delay units 36, 37 and 38, the input signal IN2 corresponds to the address transition detection signal #ATD3, the output signal of the delay unit 36, and the output signal of the delay unit 37, respectively, while the output signal OUT2 corresponds to the output signal of the delay unit 36, the output signal of the delay unit 37, and the output signal (sense signal #SS) of the delay unit 38, respectively.

In this structure, the L output delay inverter 63 in the delay unit 36 outputs, when the input signal IN2 rises to "H", a reverse delay signal of "L" with delay time determined by a third RC time constant of the resistor R3 and the capacitor C3 as compared with when the input falls to "L", resulting in a delay in transmitting the "H" rising signal from the input signal IN2 to the output signal OUT2. In contrast, when the input signal IN2 falls to "L", the L output delay inverter 63 outputs a reverse signal of "H" immediately, resulting in no delay in transmitting the "L" falling signal. In this manner, the delay unit 36 outputs the output signal OUT2 by delaying the "H" rising time of the input signal IN2 by a specified amount of time.

Referring back to FIG. 9, the sense signal #SS falls to "L" immediately with the address transition detection signal #ATD3 falling to "L" as a trigger, and rises to "H" with delay time by the delay units 36 to 38 with the address transition detection signal #ATD3 rising to "H" as a trigger.

On the other hand, the latch signal SL1 is usually "L" because either of the inputs of the NAND gate G3 is "L", and generates "H" pulses only for a specified amount of time (delay time in transmitting a signal of the inverters G18 to G20) from the time when the sense signal #SS rises to H".

Figure 11:
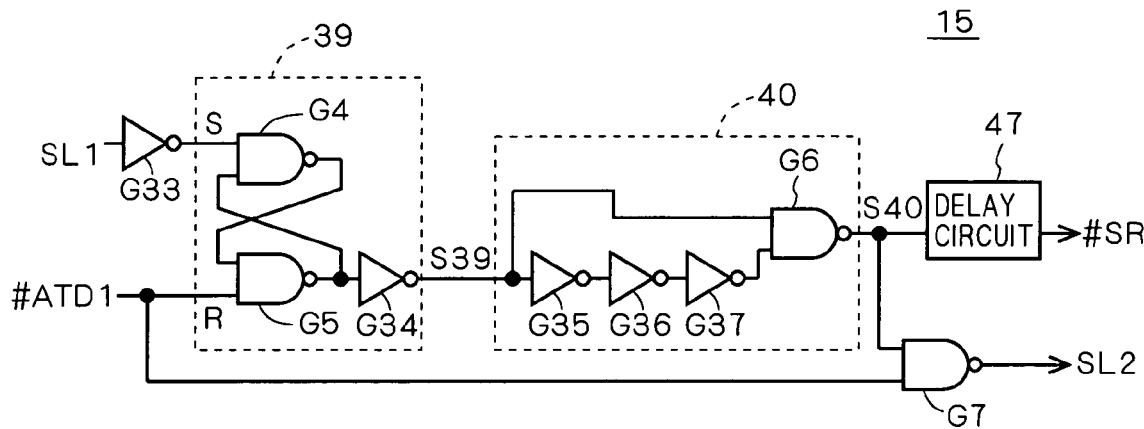
FIG. 11 is a circuit diagram showing the internal structure of an address reversal control circuit shown in FIG. 4.

FIG. 11 is a circuit diagram showing the internal structure of the address reversal control circuit 15. As shown, the circuit 15 includes an inverter G33, an RS flip-flop 39, a one-shot pulse generation circuit 40, a NAND gate G7, and a delay circuit 47.

The inverter G33 receives the latch signal SL1, and outputs to an S (set) input part of the RS flip-flop 39. The address transition detection signal #ATD1 is input to an R (reset) input part of the RS flip-flop 39.

The RS flip-flop 39 includes NAND gates G4, G5 and an inverter G34, in which one input of each of the NAND gates G4 and G5 serves as the S input part and R input part respectively, the output of the NAND gate G4 is returned as the other input of the NAND gate G5, and the output of the NAND gate G5 is returned as the other input of the NAND gate G4. The inverter G34 has an input connected to the output of the NAND gate G5, and outputs an FF output signal S39.

In the RS flip-flop 39 having this structure, the FF output signal S39 is set to "H" with the latch signal SL1 rising to "H" as a trigger, and set to "L" with the address transition detection signal #ATD1 falling to "L" as a trigger.

The one-shot pulse generation circuit 40 includes inverters G35 to G37 connected in series and a NAND gate G6, in which the input of the inverter G35 receives the FF output signal S39. The NAND gate G6 has one input for receiving the FF output signal S39 and the other input connected to the output of the inverter G37, and outputs the reversal indication signal #SR via the delay circuit 47. Although the address reversal control circuit 15 outputs the reversal indication signal #SR via the delay circuit 47, the circuit 15 may output the signal #SR directly from the one-shot pulse generation circuit 40.

The NAND gate G7 has one input for receiving the output of the NAND gate G6 and the other input for receiving the address transition detection signal #ATD1, and outputs the latch signal SL2.

With this structure, the reversal indication signal #SR which is output from the one-shot pulse generation circuit 40 via the delay circuit 47 is usually "H" because either of the inputs of the NAND gate G6 is "L", and generates "L" pulses only for a specified amount of time (delay time in transmitting a signal of the inverters G35 to G37) after a lapse of delay time by the delay circuit 47 from the time when the FF output signal S39 rises to "H".

Accordingly, when the RS flip-flop 39 is reset by an "L" fall of the address transition detection signal #ATD1 and then set by a first "H" rise of the latch signal SL1, the address reversal control circuit 15 generates "L" pulses indicating a bit reversal process as the reversal indication signal #SR obtained from the one-shot pulse generation circuit 40 via the delay circuit 47.

Further, when either of an output signal S40 (reversal indication signal #SR before being delayed) of the one-shot pulse generation circuit 40 and the address transition detection signal #ATD1 generates "L" pulses, the address reversal control circuit 15 generates "L" pulses as the latch signal SL2.

Figure 12:
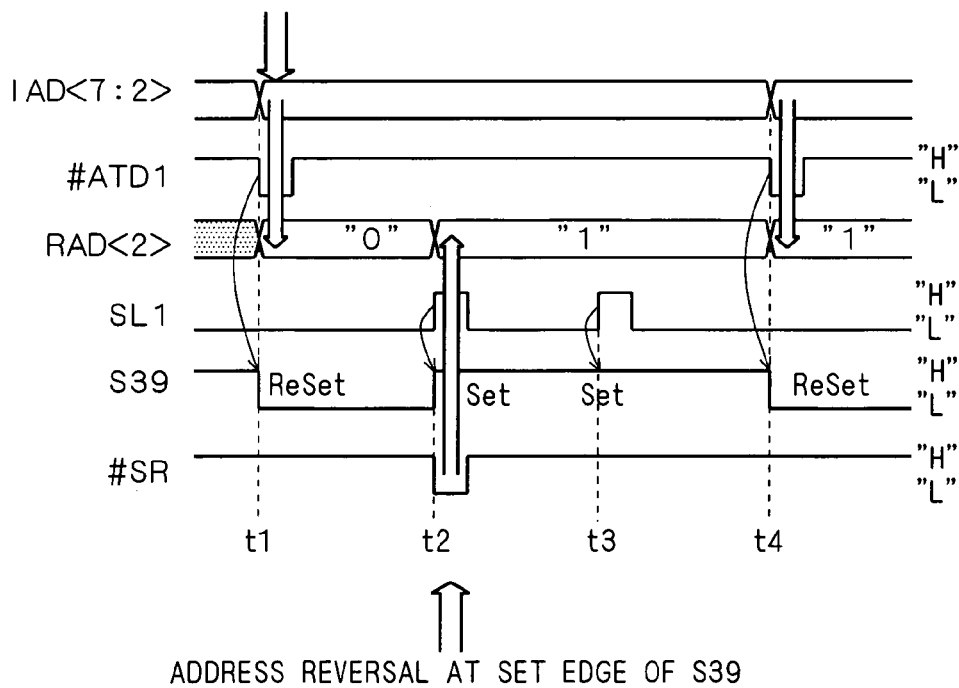
FIG. 12 is a timing diagram illustrating the operations of the address reversal control circuit and its peripheral circuits.

FIG. 12 is a timing diagram illustrating the operations of the address reversal control circuit 15 and its peripheral circuits. As shown, at time t1, the ATD circuit section 14 detects a transition of the internal address IAD <7:2>, and the address transition detection signal #ATD1 falls to "L".

With the address transition detection signal #ATD1 falling to "L" as a trigger, the internal address IAD <2> is output as the reversal process address RAD <2> from the address buffer 13. Simultaneously, the RS flip-flop 39 in the address reversal control circuit 15 is reset, causing the FF output signal S39 to fall to "L".

Then, at time t2 after a lapse of a specified amount of time from time t1, the RS flip-flop 39 is set with the latch signal SL1 rising to "H" as a trigger, causing the FF output signal S39 to rise to "H", and as a result, the reversal indication signal #SR falls to "L". Note that in FIG. 12, for the sake of explanation, the output signal S40 of the one-shot pulse generation circuit 40 is output as the reversal indication signal #SR without being processed by the delay circuit 47.

With the reversal indication signal #SR falling to "L" as a trigger, a reverse signal of the internal address IAD <2> is output as the reversal process address RAD <2> from the address buffer 13.

Then, at time t3 after a lapse of a specified amount of time from time t2, the latch signal SL1 rises to "H" again. However, the FF output signal S39 has been "H" since time t2 and remains in "H", keeping the reversal indication signal #SR from falling to "L".

Thereafter, at time t4, the ATD circuit section 14 detects a transition of the internal address IAD <7:2>, and the address transition detection signal #ATD1 falls to "L". With the address transition detection signal #ATD1 falling to "L" as a trigger, the internal address IAD <2> is output as the reversal process address RAD <2> from the address buffer 13. Simultaneously, the RS flip-flop 39 in the address reversal control circuit 15 is reset, causing the FF output signal S39 to fall to "L".

Figure 13:
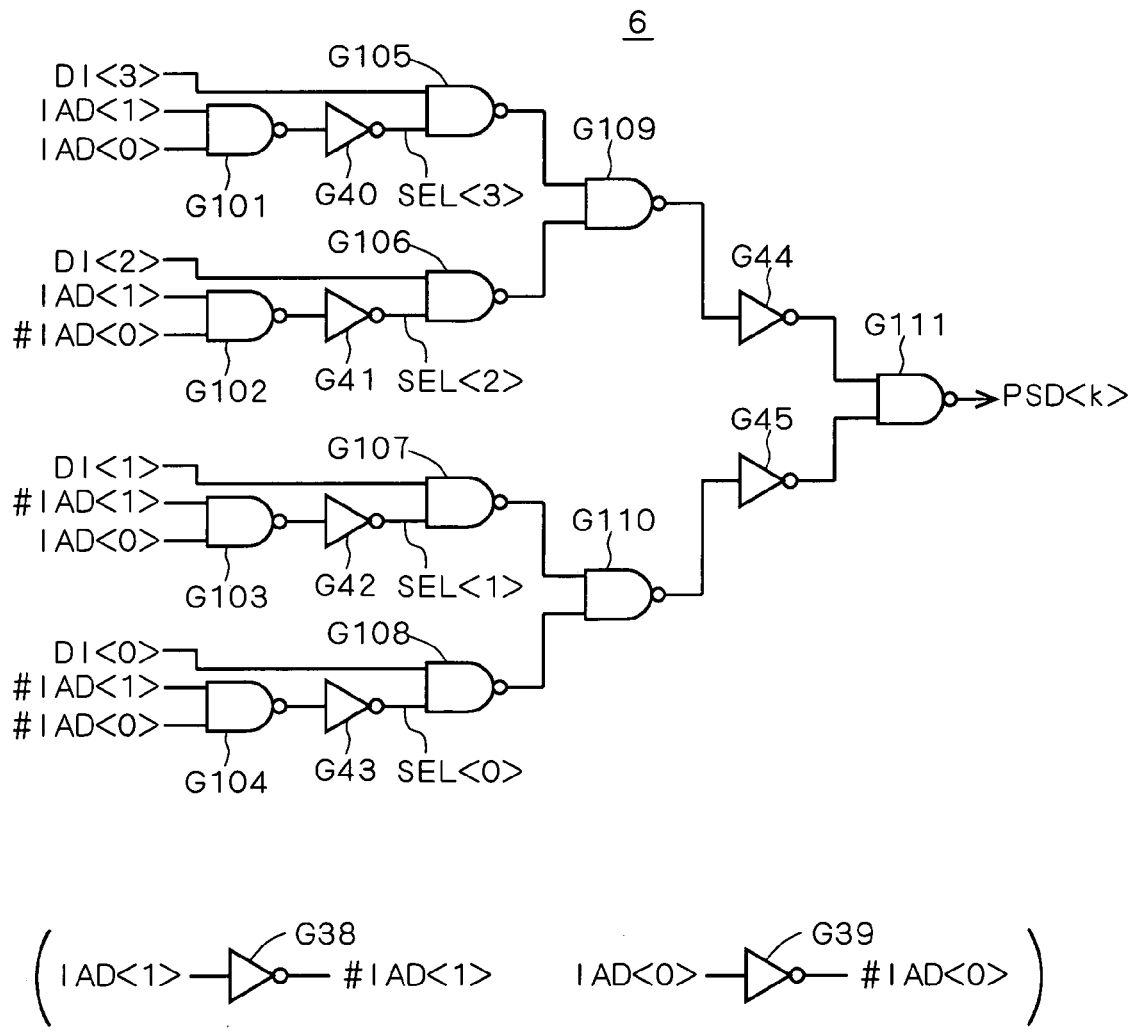
FIG. 13 is a circuit diagram showing the internal structure of a selector circuit shown in FIG. 1.

FIG. 13 is a circuit diagram showing the internal structure of the selector circuit 6 shown in FIG. 1. This is a selector circuit of partial page data DI <0> to DI <3> that correspond to a prescribed bit PSD <k> (k=any number from 0 to 15) among the 16 bits of page selection data PSD, and are classified under addresses identifiable by the internal address IAD <1:0>. There are actually FIG. 13 structures provided for 16 bits of the page selection data PSD, but circuit portions (G101 to G104, G40 to G43) for generating selection signals SEL <3:0> may be shared in each bit of the page selection data PSD.

A NAND gate G101 has one input for receiving the internal address <1> and the other input for receiving the internal address <0>, and an inverter G40 receives the output of the NAND gate G101.

A NAND gate G102 has one input for receiving the internal address <1> and the other input for receiving a reverse internal address #IAD <0>, and an inverter G41 receives the output of the NAND gate G102. The reverse internal address #IAD <0> is obtained as the output of an inverter G39 that receives the internal address IAD <0>.

A NAND gate G103 has one input for receiving a reverse internal address #IAD <1> and the other input for receiving the internal address <0>, and an inverter G42 receives the output of the NAND gate G103. The reverse internal address #IAD <1> is obtained as the output of an inverter G38 that receives the internal address IAD <1>.

A NAND gate G104 has one input for receiving the reverse internal address #IAD <1> and the other input for receiving the reverse internal address #IAD <0>, and an inverter G43 receives the output of the NAND gate G104.

A NAND gate G105 has one input for receiving the partial page data DI <3> and the other input for receiving the selection signal SEL <3> which is the output signal of the inverter G40.

A NAND gate G106 has one input for receiving the partial page data DI <2> and the other input for receiving the selection signal SEL <2> which is the output signal of the inverter G41.

A NAND gate G107 has one input for receiving the partial page data DI <1> and the other input for receiving the selection signal SEL <1> which is the output signal of the inverter G42.

A NAND gate G108 has one input for receiving the partial page data DI <0> and the other input for receiving the selection signal SEL <0> which is the output signal of the inverter G43.

A NAND gate G109 has one and the other inputs connected to the outputs of the NAND gates G105 and G106 respectively, and a NAND gate G110 has one and the other inputs connected to the outputs of the NAND gates G107 and G108 respectively. The outputs of the NAND gates G109 and G110 are connected to the inputs of inverters G44 and G45 respectively.

A NAND gate G111 has one and the other inputs connected to the outputs of the inverters G44 and G45 respectively, and outputs the page selection data PSD <k>.

In this structure, only one of the selection signals SEL <3:0> becomes "H" by the internal address IAD <1:0>. If we let the selection signal that became "H" be a selection signal SEL <j> (j=any number from 0 to 3), partial page data DI <j> is output as the page selection data PSD <k>.

Figure 14:
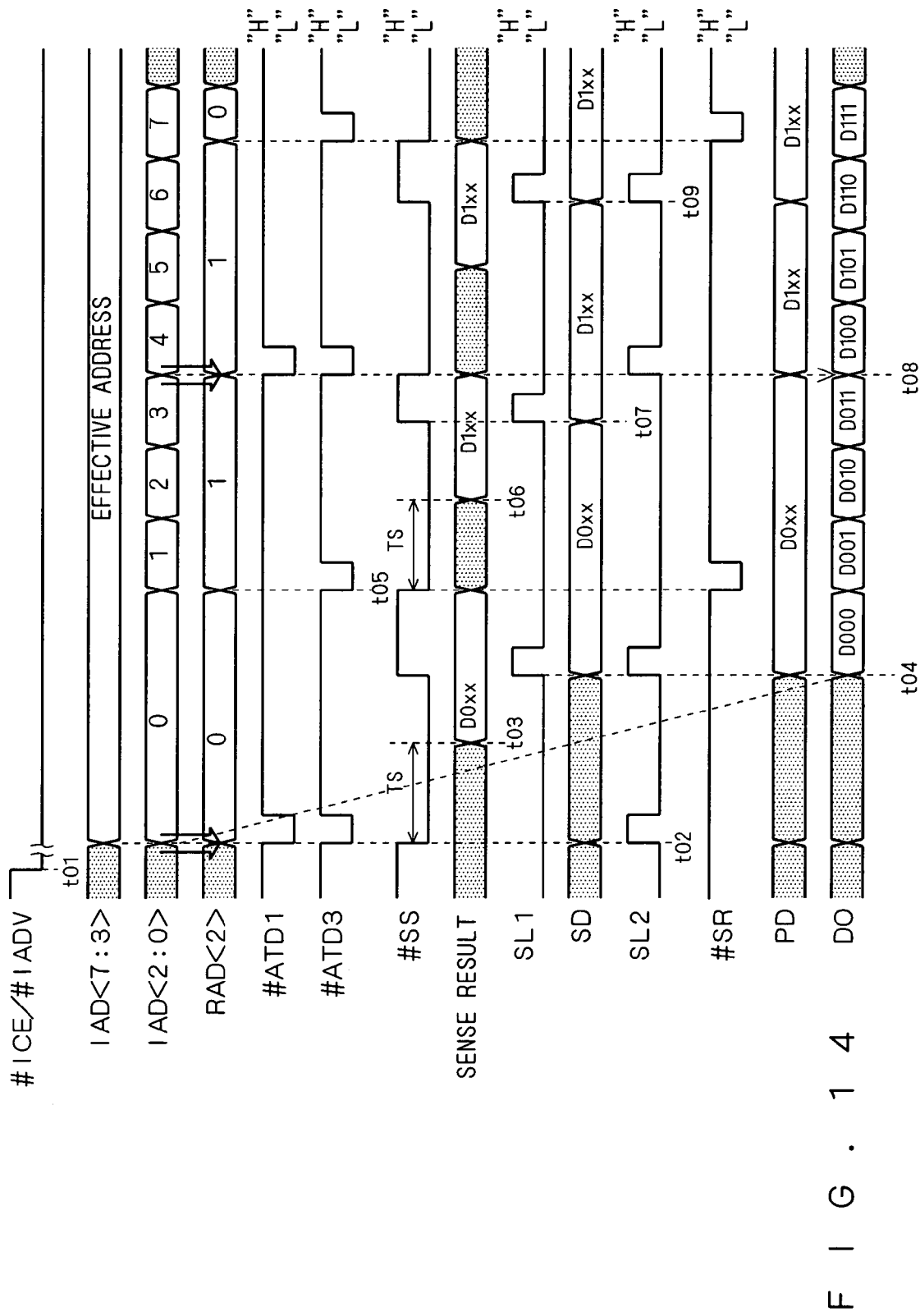
FIG. 14 is a timing diagram illustrating the page mode reading function of the semiconductor memory device according to the first preferred embodiment of this invention.

FIG. 14 is a timing diagram illustrating the page mode reading operation of the semiconductor memory device according to the first preferred embodiment of this invention, which will be explained below.

First, at time t01, the internal chip enable signal #ICE and the internal address valid signal #IADV fall to "L", causing the address buffer 13 to enter an active state to render the semiconductor memory device into an operating state.

Then, at time t02, the ATD circuit section 14 detects a transition of the internal address IAD <7:2>, and the address transition detection signals #ATD1 and #ATD3 fall to "L". Simultaneously, the sense signal #SS falls to "L" and the latch signal SL2 rises to "H".

If we let the internal address IAD <2> at this time be "0", the internal address IAD <2> is output as the reversal process address RAD <2> from the address latch circuit 10 with the address transition detection signal #ATD1 falling to "L" as a trigger.

Simultaneously with the above operation, the X decoder 8 outputs the X selection signal SX based on the internal address IAD <7:5>, and the Y decoder 9 outputs the Y selection signal SY based on the internal address <4:3> and the reversal process address RAD <2>. Then, the memory data of the memory cells selected from the memory cell array 1 based on the X selection signal SX are read onto the 512 bits of main bit lines MBa, and the 64 bits of data (first memory cell information group) selected by the Y gate 2 based on the Y selection signal SY is supplied to the sense amplifier 3.

The sense amplifier 3 enters an active state by the "L" fall of the sense signal #SS to perform a sense amplifying operation, and at time t03 after a lapse of time TS from time t02, a sense result (D0xx) of the supplied 64 bits of data appears. The sense signal #SS then rises to "H".

Thereafter, the latch signal SL1 rises to "H" at time t04, which triggers the latch signal SL2 to rise to "H". The sense result by the sense amplifier 3 is latched into the latch 4 for sense data as the sense data SD, and the sense data SD is latched into the latch 5 for page data as the page data PD (D0xx).

The result is that the page data PD latched into the latch 5 for page data is supplied to the selector circuit 6 which outputs the page selection data PSD (D000) corresponding to a first designated address by the internal address IAD <1:0> via the output buffer 7 as the external data DO.

In this manner, since the sense amplifying operation by the sense amplifier 3 is required, it takes time between time t01 and time t04 to obtain first external data DO (D000).

Subsequently, page mode reading outputs are performed in which following the above "D000", the page data PD latched into the latch 5 for page data is selected by the selector circuit 6 in the order designated by the internal address IAD <1:0>, namely in the order of "D001", "D010", "D011", to be output sequentially as the external data DO from the output buffer 7. That is, after time t04, 4 words of data are sequentially read.

Then, at time t05 after a lapse of delay time by the delay circuit 47 from time t04 when the latch signal SL1 rises to "H", the reversal indication signal #SR falls to "L". At this time t05, by outputting a reverse signal of the internal address IAD <2> as the reversal process address RAD <2> from the address latch circuit 10, a bit reversal process is performed for artificially (temporarily) reversing the reversal process address RAD <2> which is prescribed bits of the high order address from "0" into "1". The "artificial reversal" shall mean reversing "1" of the internal address IAD <2> for a temporary amount of time between time t05 and time t08 thus obtaining the reversal process address RAD <2>.

The result is that new 64 bits of memory cell information (second memory cell information group) selected by the Y gate 2 is immediately supplied to the sense amplifier 3 based on the Y selection signal SY changed by a transition of the reversal process address RAD <2>.

Then, with the transition of the reversal process address RAD <2> as a trigger, the address transition detection signal #ATD3 falls to "L" and the sense signal #SS falls to "L", causing the sense amplifier 3 to enter an active state again.

Then, at time t06 after a lapse of time TS from time t05, a new sense result (D1xx) (based on the second memory cell information group) when the reversal process address RAD <2> is "1" appears. The sense signal #SS then rises to "H".

At time t07 after a lapse of a specified amount of time from time t06, the latch signal SL1 rises to "H", and the sense data SD latched into the latch 4 for sense data is changed from D0xx (data of the first memory cell information group) to D1xx (data of the second memory cell information group).

In this manner, the latch signal SL1 becomes "H" after a lapse of a specified amount of time in response to the "L" fall of the address transition detection signal #ATD3, allowing the sense result obtained by the sense amplifier 3 after a transition of the reversal process address RAD <2> to be latched immediately.

At this time, the latch signal SL2 remains in "L" irrespective of a transition of the reversal process address RAD <2>. Accordingly, the page mode reading outputs described above are performed smoothly without the page data PD of the latch 5 for page data being updated.

In this manner, by generating the reversal indication signal #SR that performs a bit reversal process in response to the latch timings of the latch signals SL1 and SL2, it is possible to perform a sense operation on the latter 4 words of data (data based on the second memory cell information group) by the memory cell array 1, the Y gate 2, the sense amplifier 3, and the latch 4 for sense data simultaneously with a page mode reading operation on the former 4 words of data (data based on the first memory cell information group) by the latch 5 for page data, the selector circuit 6, and the output buffer 7, after time t04.

Then, at time t08 when the outputs of 4 words of external data DO from D000 to D003 are completed, the internal address IAD <2> changes (from "0" to "1"). At this time t08, the next data to be read (D1xx) has been latched into the latch 4 for sense data.

Following an "L" fall of the address transition detection signal #ATD1 due to transition detection of the internal address IAD <2>, the internal address IAD <2> is output as the reversal process address RAD <2>. The reversal process address RAD <2>, which has become "1" since time t05, remains in "1" as a result.

At this time, the latch signal SL2 rises to "H", causing the sense data SD to be latched into the latch 5 for page data which updates the page data PD. However, the page mode reading operation is performed smoothly because the data of "D000", "D001", "D010", and "D011" have been read from the external data DO at time t08, as discussed above.

Subsequently, page mode reading outputs are performed in which the page data PD latched into the latch 5 for page data at time t08 is selected by the selector circuit 6 in the order designated by the internal address IAD <1:0>, namely in the order of "D100", "D101", "D110", "D111", to be output sequentially as the external data DO from the output buffer 7. That is, after time t04, 8 words of external data DO (data based on the first and second memory cell information groups) are sequentially read in the order of "D000", "D001", "D010", "D011", "D100", "D101", "D110", "D111".

At time t09 after time t08, the latch signals SL1 and SL2 rise to "H" so that the contents of the latch 4 for sense data and latch 5 for page data are updated by the sense result of the sense amplifier 3. However, the sense result, which is the same (D1xx) contents-wise as that at time t07, results in no change in latched contents of the latch 5 for page data, keeping the operation performed smoothly.

As such, the page mode control circuit formed by the address latch circuit 10, the ATD circuit section 14, the address reversal control circuit 15, and the sense control circuit 16 performs the following operation.

The first memory cell information group read from the memory cell array 1 based on the internal address IAD <7:3> that defines the former 4 words of address (first address) and the reversal process address RAD <2> is latched into the latch 5 for page data as the page data PD via the sense amplifier 3 and the latch 4 for sense data, and then the bit reversal process is performed for artificially reversing the reversal process address RAD <2>, to generate the address of the latter 4 words (second address) successive to the address of the former 4 words from the address latch circuit 10.

Then, during a page mode reading period based on the first memory cell information group, the second memory cell information group read from the memory cell array 1 based on the high order address signal that defines the address of the latter 4 words is stored in the latch 4 for sense data via the sense amplifier 3 as 64 bits of sense data SD.

After the page mode reading period based on the first memory cell information group has elapsed, the 64 bits of sense data SD based on the second memory cell information group stored in the latch 4 for sense data is latched into the latch 5 for page data as the page data PD, thus sequentially setting a page mode reading period based on the second memory cell information group after the page mode reading period based on the first memory cell information group.

The result is that a page mode reading operation of substantially 8 words of page length is attained while keeping the page mode reading function of 4 words of page length as conventional-level hardware structure.

Therefore, the semiconductor memory device according to the first preferred embodiment has a page mode reading function of 8 word pages while keeping the number of simultaneously activated bits of the sense amplifier 3 and the memory capacity of the latches 4 and 5 to 4 word pages' worth, thereby minimizing a peak current at the time of page mode reading and an increase in layout area of a circuit that achieves the page mode reading function.

In this embodiment, the latter 4 words of data is read during the page mode reading period of the former 4 words of data to the outside. It is also conceivable that a shift to the page mode reading period of the latter 4 words of data to the outside is made immediately after determination of the latter 4 words of sense data SD.

Nevertheless, in order to ensure the page mode reading operation of the former 4 words of data to the outside with reliability, it would be more appropriate to raise the latch signal SL2 to "H" at time t08 when the page mode reading operation on the former 4 words of data to the outside is completed, and then shift to the page mode reading period of the latter 4 words of data to the outside.

Although the internal address IAD <1:0> is output in the order of "00", "01", "10", "11" in this embodiment, it may be output in any desired order.

<Second Preferred Embodiment>

Figure 15:
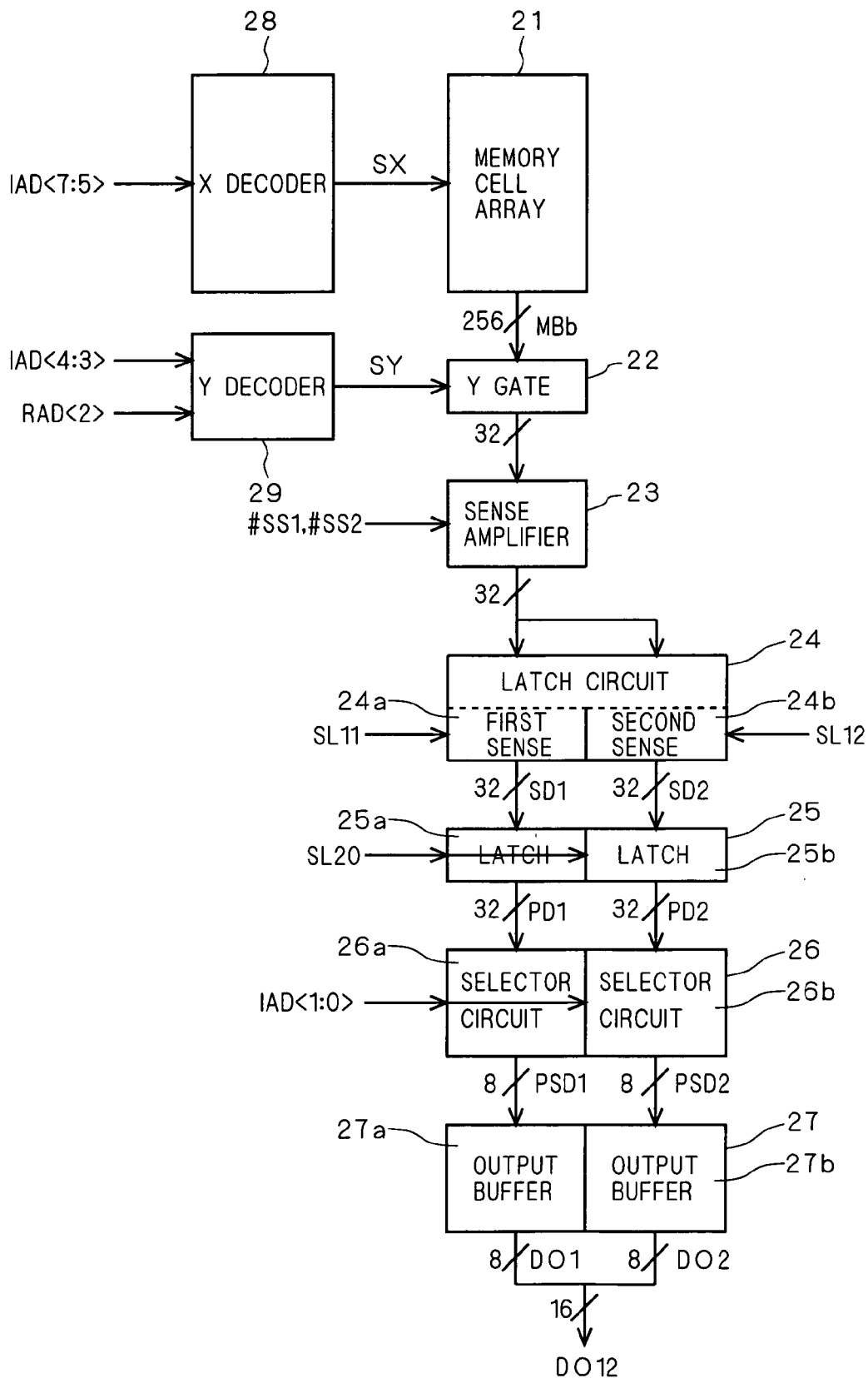
FIG. 15 is a block diagram showing the structure of the peripheral part of a memory cell array in a semiconductor memory device according to a second preferred embodiment of this invention.

FIG. 15 is a block diagram showing the structure of the peripheral part of a memory cell array in a semiconductor memory device according to a second preferred embodiment of this invention. FIG. 15 illustrates the case of 4 word pages in which the X selection signal SX is selected by the internal address IAD <7:5>, the Y selection signal SY is selected by the internal address IAD <4:3> and the reversal process address RAD <2>, 32 bits (prescribed number) of multivalued data is read by the X selection signal SX and the Y selection signal SY, and 2 bits of internal address IAD <1:0> is used as a page address.

A memory cell array 21 includes a plurality of memory cells arranged in a matrix each of which is capable of storing four-valued information, and reads memory data from memory cells selected among the plurality of memory cells based on the X selection signal SX onto a total of 256 main bit lines MBb respectively.

A Y gate 22 selects and electrically connects 32 lines (prescribed number) among the 256 main bit lines MBb to a sense amplifier 23 based on the Y selection signal SY.

The sense amplifier 23 enters an active state when a sense signal #SS2 is "L" to perform a sense amplifying operation by detecting and amplifying the memory data that appear on the 32 main bit lines MBb selected by the Y gate 22. The sense amplifying operation includes first and second sense amplifying operations that are performed sequentially during a sense amplifying period. The first sense amplifying operation is performed when the sense signal #SS1 is "L" to obtain high order bit information of the memory data, and the second sense amplifying operation is performed when the sense signal #SS1 is "H" to obtain low order bit information of the memory data. Thirty-two units of sense result (high order bit information or low order bit information) obtained by the sense amplifier 23 is supplied to a latch 24 for sense data.

The latch 24 for sense data includes a first sensing latch part 24a and a second sensing latch part 24b. The first sensing latch part 24a enters an active state when a latch signal SL11 is "H" to latch the 32 high order bit information amplified by the sense amplifier 23 as sense data SD1. The second sensing latch part 24b enters an active state when a latch signal SL12 is "H" to latch the 32 low order bit information amplified by the sense amplifier 23 as sense data SD2. Thus, the latch 24 for sense data latches the sense data SD1+SD2 of 32×2=64 bits (prescribed bit number).

The first and second sensing latch parts 24a and 24b hold the latched sense data SD1 and SD2 afterwards until the latch signals SL11 and SL12 respectively become "H" again. Thus, the sense data SD1 and SD2 latched into the latch 24 for sense data are held even when the sense amplifier 23 enters an inactive state.

A latch 25 for page data includes a first sensing latch part 25a and a second sensing latch part 25b, and enters an active state when a latch signal SL20 is "H" to latch the sense data SD1 and SD2 stored in the latch 24 for sense data into the first and second sensing latch parts 25a and 25b, respectively. Then, the data latched into the first sensing latch part 25a is output as first page data PD1, and the data latched into the second sensing latch part 25b is output as second page data PD2. The first and second page data PD1 and PD2 are classifiable under four partial page data, respectively.

A selector circuit 26 includes a first sensing selection part 26a and a second sensing selection part 26b which output 8 bits of page selection data PSD1 and PSD2 from the page data PD1 and PD2, respectively, based on an address selected by the commonly input internal address IAD <1:0>. In short, conventional-level hardware structure formed by the sense amplifier 23, the latch 24 for sense data, the latch 25 for page data, and the selector circuit 26 has a page mode reading function of multivalued data of 4 words of page length.

An output buffer 27 includes a first sensing buffer part 27a and a second sensing buffer part 27b which buffer and output the page selection data PSD1 and PSD2 as first external data DO1 and second external data DO2, respectively. The first and second external data DO1 and DO2 form external data DO12, which is output ultimately.

An X decoder 28 outputs the X selection signal SX based on the internal address IAD <7:5>, like the X decoder 8 of the first preferred embodiment, and a Y decoder 29 outputs the Y selection signal SY based on the internal address <4:3> and the reversal process address RAD <2>, like the Y decoder 9 of the first preferred embodiment. Thus, the Y gate 22, the X decoder 28, and the Y decoder 29 form a control part for reading the 32 units of multivalued memory cell information from the memory cell array 21.

The structure of an internal address supply section is similar to that of the first preferred embodiment as shown in FIG. 2, so an explanation thereof is omitted.

Figure 16:
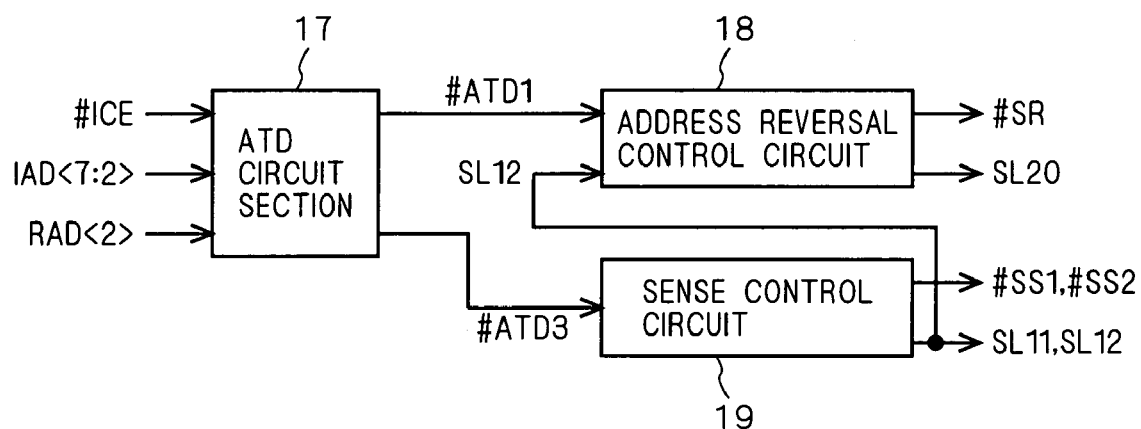
FIG. 16 is a circuit diagram showing the principal part structure of a page mode control circuit.

FIG. 16 is a circuit diagram showing the principal part structure of a page mode control circuit for outputting all kinds of control signals to the peripheral part of the memory cell array 21 shown in FIG. 15. As shown, an ATD circuit section 17 receives the internal chip enable signal #ICE, the internal address IAD <7:2>, and the reversal process address RAD <2>, to output the address transition detection signals #ATD1 and #ATD3, like the ATD circuit section 14 of the first preferred embodiment as shown in FIG. 4.

A sense control circuit 19 outputs the sense signals #SS1 and #SS2 and the latch signals SL11 and SL12 based on the address transition detection signal #ATD3.

Figure 17:
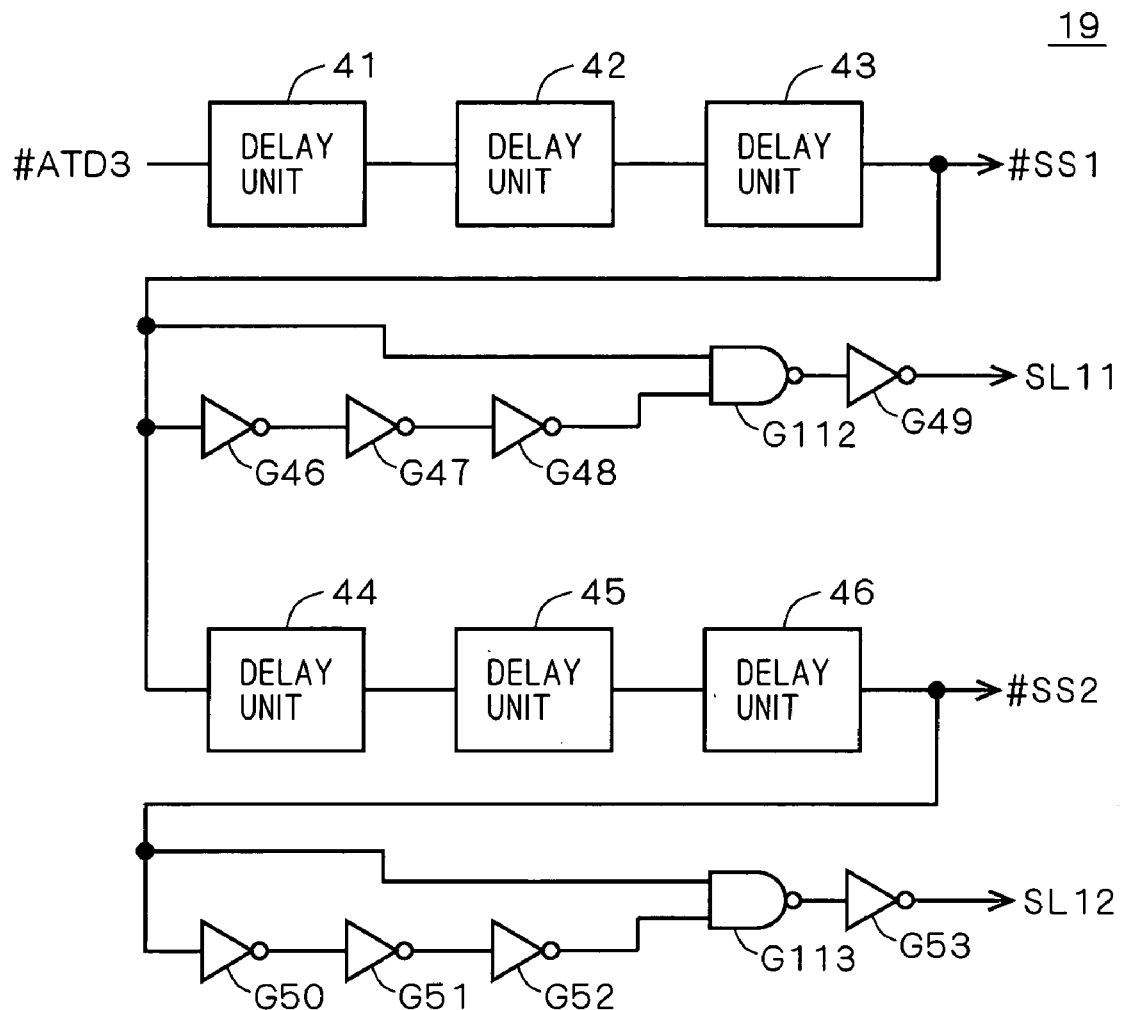
FIG. 17 is a circuit diagram showing the internal structure of a sense control circuit shown in FIG. 16.

FIG. 17 is a circuit diagram showing the internal structure of the sense control circuit 19. As shown, among delay units 41 to 43 connected in three-stage series, the unit 41 in the first stage receives the address transition detection signal #ATD3, and the unit 43 in the last stage outputs the sense signal #SS1. Among inverters G46 to G48 connected in three-stage series, the inverter G46 in the first stage receives the sense signal #SS1. A NAND gate G112 has one input for receiving the sense signal #SS1 and the other input for receiving the output of the inverter G48, and outputs the latch signal SL11 via an inverter G49.

Further, among delay units 44 to 46 connected in three-stage series, the unit 44 in the first stage receives the sense signal #SS1, and the unit 46 in the last stage outputs the sense signal #SS2. Among inverters G50 to G52 connected in three-stage series, the inverter G50 in the first stage receives the sense signal #SS2. A NAND gate G113 has one input for receiving the sense signal #SS2 and the other input for receiving the output of the inverter G52, and outputs the latch signal SL12 via an inverter G53. The internal structure of the delay units 41 to 46 is similar to that of the delay units 36 to 38 of the first preferred embodiment as shown in FIG. 10.

In this structure, the sense signals #SS1 and #SS2 both fall to "L" immediately with the address transition detection signal #ATD3 falling to "L" as a trigger, and rise to "H" with delay time by the delay units 41 to 43 and the delay units 41 to 46, respectively, with the address transition detection signal #ATD3 rising to "H" as a trigger.

On the other hand, the latch signals SL11 and SL12 are usually "L" because either of the inputs of the NAND gates G112 and G113 is "L", and generate "H" pulses only for a specified amount of time (delay time in transmitting a signal of the inverters G46 to G48 and the inverters G50 to G52) from the time when the sense signals #SS1 and #SS2 rise to H", respectively.

Referring back to FIG. 16, an address reversal control circuit 18 outputs the reversal indication signal #SR and the latch signal SL20 based on the address transition detection signal #ATD1 and the latch signal SL12. The internal structure of the circuit 18 is similar to that of the address reversal control circuit 15 of the first preferred embodiment as shown in FIG. 11, except that the latch signal SL1 to be input is replaced by the latch signal SL12, and the latch signal SL2 to be output is replaced by the latch signal SL20.

The address latch circuit 10 (same as the first preferred embodiment), the ATD circuit section 17, the address reversal control circuit 18, the sense control circuit 19, and so on form a page mode control circuit capable of controlling page mode, as in the first preferred embodiment.

Figure 18:
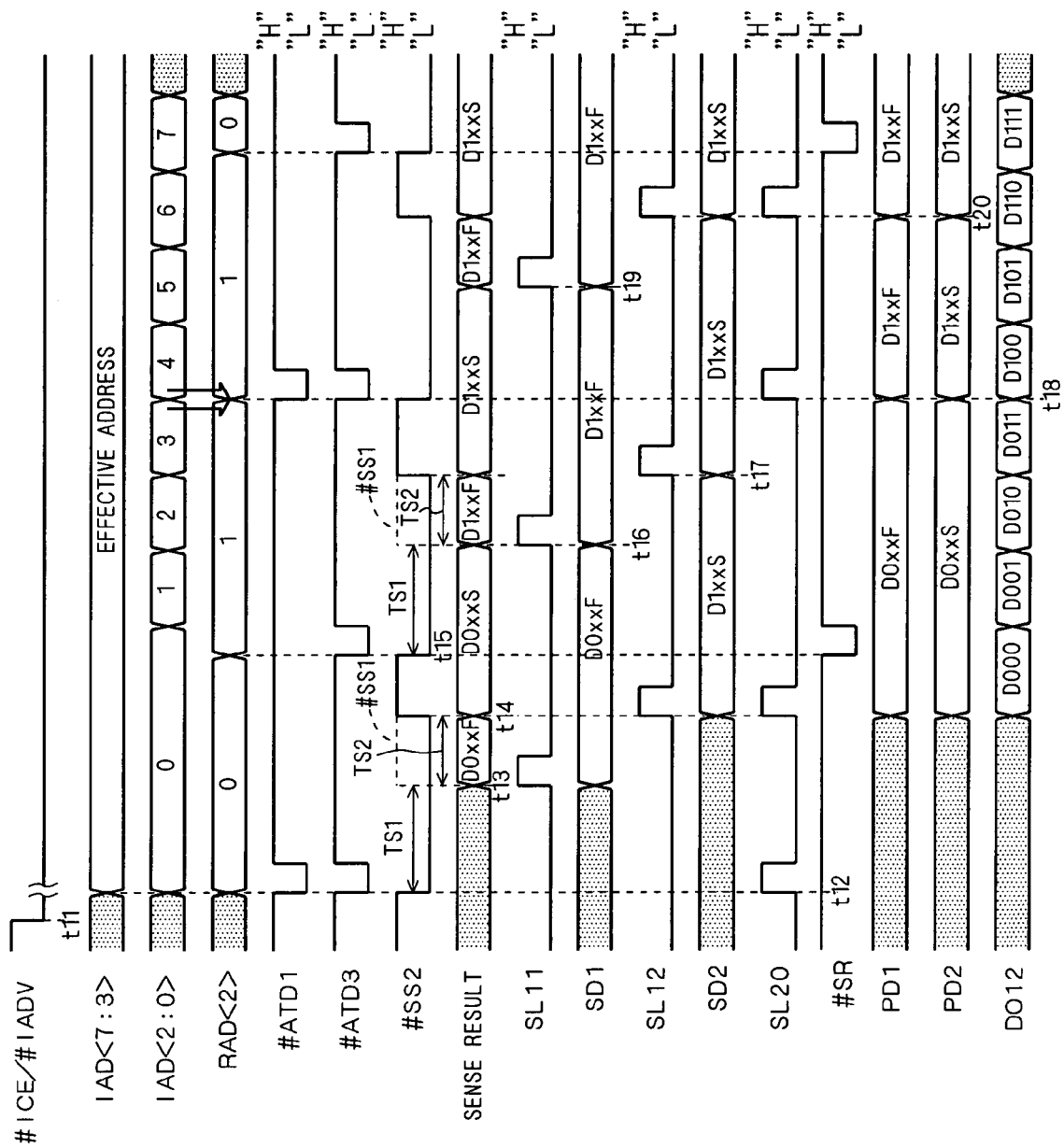
FIG. 18 is a timing diagram illustrating the page mode reading function of the semiconductor memory device according to the second preferred embodiment of this invention.

FIG. 18 is a timing diagram illustrating the page mode reading operation of the semiconductor memory device according to the second preferred embodiment of this invention, which will be explained below.

First, at time t11, the internal chip enable signal #ICE and the internal address valid signal #IADV fall to "L", causing the address buffer 13 to enter an active state to render the semiconductor memory device into an operating state.

Then, at time t12, the ATD circuit section 17 detects a transition of the internal address IAD <7:2>, and the address transition detection signals #ATD1 and #ATD3 fall to "L". Simultaneously, the sense signal #SS2 (#SS1) falls to "L" and the latch signal SL20 rises to "H".

If we let the internal address IAD <2> at this time be "0", the internal address IAD <2> is output as the reversal process address RAD <2> from the address latch circuit 10 with the address transition detection signal #ATD1 falling to "L" as a trigger.

Simultaneously with the above operation, the X decoder 28 outputs the X selection signal SX based on the internal address IAD <7:5>, and the Y decoder 29 outputs the Y selection signal SY based on the internal address <4:3> and the reversal process address RAD <2>. Then, the memory data of the memory cells selected from the memory cell array 21 based on the X selection signal SX are read onto the 256 bits of main bit lines MBb, and the 32 units of multivalued data selected by the Y gate 2 based on the Y selection signal SY is supplied to the sense amplifier 23.

The sense amplifier 23 enters an active state by the "L" fall of the sense signal #SS2 to perform the first sense amplifying operation, and at time t13 after a lapse of time TS1 from time t12, a sense result (D0xxF) of the high order bit information of the 32 units of data supplied from the Y gate 22 appears. At this time, the sense result is latched as the first sense data SD1 by an "H" rise of the latch signal SL11.

The sense signal #SS1 rises to "H" almost simultaneously with time t13, causing the sense amplifier 23 to start the second sense amplifying operation, and at time t14 after a lapse of time TS2 from time t13, a sense result (D0xxS) of the low order bit information of the 32 units of data supplied from the Y gate 22 appears. At this time, the sense result is latched as the second sense data SD2 by an "H" rise of the latch signal SL12.

The latch signal SL12 rises to "H" at time t14, which triggers the reversal indication signal #SR to fall to "L" and the latch signal SL20 to rise to "H". The result is that the first and second sense data SD1 and SD2 are latched as the first and second page data PD1 and PD2 of the first and second sensing latch parts 25a and 25b in the latch 25 for page data.

Then, the page data PD1 and PD2 latched into the latch 25 for page data are supplied to the selector circuit 26 which outputs the page selection data PSD (D000 (D000F, D000S)) corresponding to a first designated address by the internal address IAD <1:0> via the output buffer 27 as the external data DO12.

In this manner, since the sense amplifying operation by the sense amplifier 23 is required, it takes time between time t11 and time t14 to obtain first external data DO12 (D000).

Subsequently, page mode reading outputs are performed in which following the above "D000 (D000F, D000S)", the page data PD latched into the latch 25 for page data is selected by the selector circuit 26 in the order designated by the internal address IAD <1:0>, namely in the order of "D001 (D001F, D001S)", "D010 (D010F, D010S)", "D011 (D011F, D011S)", to be output sequentially as the external data DO12 from the output buffer 27. That is, after time t14, 4 words of data are sequentially read.

Then, at time t15 a little later than time t14, the reversal indication signal #SR falls to "L", and a reverse signal of the internal address IAD <2> is output as the reversal process address RAD <2>, thus reversing the reversal process address RAD <2> from "0" into "1".

The result is that new 32 units of multivalued data selected by the Y gate 22 is supplied to the sense amplifier 23 based on the Y selection signal SY changed by a transition of the reversal process address RAD <2>.

Then, with the transition of the reversal process address RAD <2> as a trigger, the address transition detection signal #ATD3 falls to "L" and the second sense signal #SS2 falls to "L", causing the sense amplifier 23 to enter an active state again to start the first sense amplifying operation.

Then, at time t16 after a lapse of time TS1 from time t15, a new sense result (D1xxF) when the reversal process address RAD <2> is "1" appears. At this time, the sense result is latched as the first sense data SD1 by an "H" rise of the latch signal SL11. That is, the first sense data SD1 latched into the first sensing latch part 24a is changed from D0xxF to D1xxF.

The sense signal #SS1 rises to "H" almost simultaneously with time t16, causing the sense amplifier 23 to start the second sense amplifying operation. At time t17 after a lapse of time TS2 from the "H" rise of the sense signal #SS1, a sense result (D1xxS) of the low order bit information of the 32 units of data supplied from the Y gate 22 appears. At this time, the sense result is latched as the second sense data SD2 by an "H" rise of the latch signal SL12. That is, the second sense data SD2 latched into the second sensing latch part 24b is changed from D0xxS to D1xxS.

At this time, the latch signal SL20 remains in "L". Accordingly, the page mode reading outputs described above are performed smoothly without the page data PD1 and PD2 of the latch 25 for page data being updated.

In this manner, after time t14, a sense operation on the latter 4 words of data by the memory cell array 21, the Y gate 22, the sense amplifier 23, and the latch 24 for sense data is performed simultaneously with an output operation on the former 4 words of data as the external data DO12 by the latch 25 for page data, the selector circuit 26, and the output buffer 27.

Then, at time t18 when the outputs of 4 words of external data DO12 from D000 to D003 are completed, the internal address IAD <2> changes (from "0" to "1"). At this time t18, the next data to be read (D1xx (D1xxF, D1xxs)) has been latched into the latch 24 for sense data.

Following an "L" fall of the address transition detection signal #ATD1 due to transition detection of the internal address IAD <2>, the internal address IAD <2> is output as the reversal process address RAD <2>. The reversal process address RAD <2>, which has become "1" since time t15, remains in "1" as a result.

At this time, the latch signal SL20 rises to "H", causing the sense data SD1 and SD2 to be latched into the latch 25 for page data which updates the page data PD1 and PD2. However, the page mode reading operation is performed smoothly because the data of "D000", "D001", "D010", and "D011" have been read from the external data DO12 at time t18, as discussed above.

Subsequently, page mode reading outputs are performed in which the page data PD1 and PD2 latched into the latch 25 for page data at time t18 are selected by the selector circuit 26 in the order designated by the internal address IAD <1:0>, namely in the order of "D100 (D100F, D100S)", "D101 (D101F, D101S)", "D110 (D110F, D110S)", "D111 (D111F, D111S)", to be output sequentially as the external data DO12 from the output buffer 27. That is, after time t14, 8 words of external data DO12 data are sequentially read in the order of "D000", "D001", "D010", "D011", "D100", "D101", "D110", "D111".

At time t19 after time t18, the latch signal SL11 rises to "H" so that the contents of the first sensing latch part 24a are updated, and time t20, the latch signals SL12 and SL20 rise to "H" so that the contents of the second sensing latch part 24b and the latch 25 for page data are updated. However, the sense result, which is the same (D1xx (D1xxF, D1xxS)) contents-wise as that at time t17, results in no change in latched contents of the latch 25 for page data, keeping the operation performed smoothly.

In this manner, the semiconductor memory device according to the second preferred embodiment renders the reversal indication signal #SR into an active state of "L" by an "H" rise of the latch signals SL12 and SL20 with reference to the time of latch completion into the latch 25 for page data, thereby achieving a smooth page mode reading function of the former page data while performing a sense operation on the latter page data.

Therefore, the semiconductor memory device according to the second preferred embodiment has, as in the first preferred embodiment, a page mode reading function of 8 word pages while keeping the number of simultaneously activated bits of the sense amplifier 23 and the memory capacity of the latches 24 and 25 to 4 word pages' worth, thereby minimizing a peak current at the time of page mode reading and an increase in layout area of a circuit that achieves the page mode reading function.

Although the internal address IAD <1:0> is output in the order of "00", "01", "10", "11" in this embodiment, as in the first preferred embodiment, it may be output in any desired order.

Additionally, the semiconductor device according to the second preferred embodiment advantageously has the effective page mode reading function as described above from the memory cell array 21 that includes memory cells storing 3 or more bits of multivalued information.

Although four-valued information is stored illustratively as multivalued information in this embodiment, ternary, five or more-valued information can be stored as well. For example, storage of octal information is attained by increasing the number m of each component from the current "2" to "3" (($2^3$)=8).

<Third Preferred Embodiment>

Figure 19:
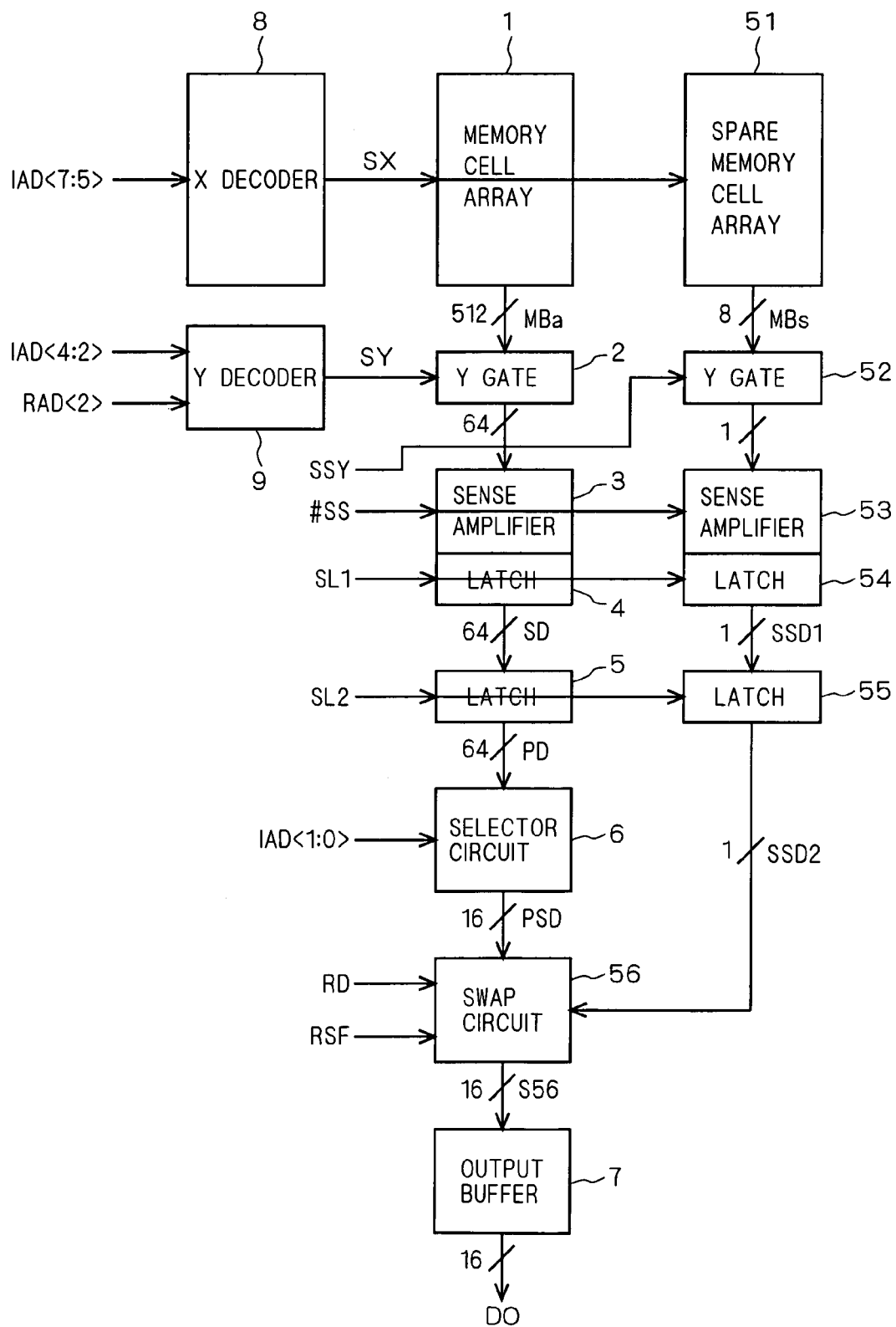
FIG. 19 is a block diagram showing the structure of the peripheral part of a memory cell array in a semiconductor memory device according to a third preferred embodiment of this invention.

FIG. 19 is a block diagram showing the structure of the peripheral part of a memory cell array in a semiconductor memory device according to a third preferred embodiment of this invention. In this Figure, components 1 to 9 each has the same structure as in the first preferred embodiment, and bears the same reference numeral.

A spare memory cell array 51 includes a plurality of spare memory cells, and reads memory data (spare information) from spare memory cells selected among the plurality of spare memory cells based on the X selection signal SX onto a total of 8 main bit lines MBs respectively.

A Y gate 52 selects and electrically connects one line (prescribed spare number) among the 8 main bit lines MBs to a sense amplifier 53 based on a spare Y selection signal SSY.

The sense amplifier 53 (sense amplifier for replacement) enters an active state when the sense signal #SS is "L", in which the sense amplifier 53 performs a sense amplifying operation by detecting and amplifying the memory data that appears on the one main bit line MBs selected by the Y gate 52.

A latch 54 for sense data (spare sensing latch) enters an active state when the latch signal SL1 is "H" to latch the signal on the one (prescribed spare bit number) main bit line MBs amplified by the sense amplifier 53 as spare sense data SSD1, and holds the latched spare sense data SSD1 afterwards until the latch signal SL1 becomes "H" again. Thus, the spare sense data SSD1 latched into the latch 54 for sense data is held even when the sense amplifier 53 enters an inactive state.

A latch 55 for page data (latch for spare data) enters an active state when the latch signal SL2 is "H" to latch the spare sense data SSD1 stored in the latch 54 for sense data as spare data SSD2.

Figure 20:
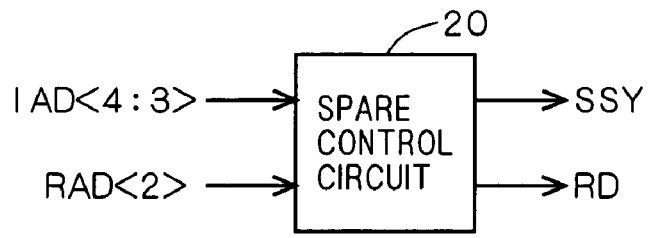
FIG. 20 is a block diagram showing the structure of a spare control circuit for generating a spare Y selection signal.

FIG. 20 is a block diagram showing the structure of a spare control circuit 20 for generating the spare Y selection signal SSY. As shown, the spare control circuit 20 determines and outputs the spare Y selection signal SSY based on the internal address IAD <4:3> and the reversal process address RAD <2>, and also outputs redundant replacement including information RD indicating replacement information in the data selected by the spare Y selection signal SSY.

Thus, the X decoder 8 (same as the first preferred embodiment), the spare control circuit 20, and the Y gate 52 form a spare read control part for reading the spare information from the spare memory cell array 51.

A swap circuit 56 (replacement performing circuit) receives the page selection data PSD and, according to indications defined by the redundant replacement information RD and a redundant information shift signal RSF (replacement information fetch control signal), when replacement is required, replaces prescribed bit data among the page selection data PSD by the spare data SSD2 which is 1 bit data for replacement, to output replaced page selection data S56.

The output buffer 7 buffers and outputs the replaced page selection data S56 as the external data DO.

Figure 21:
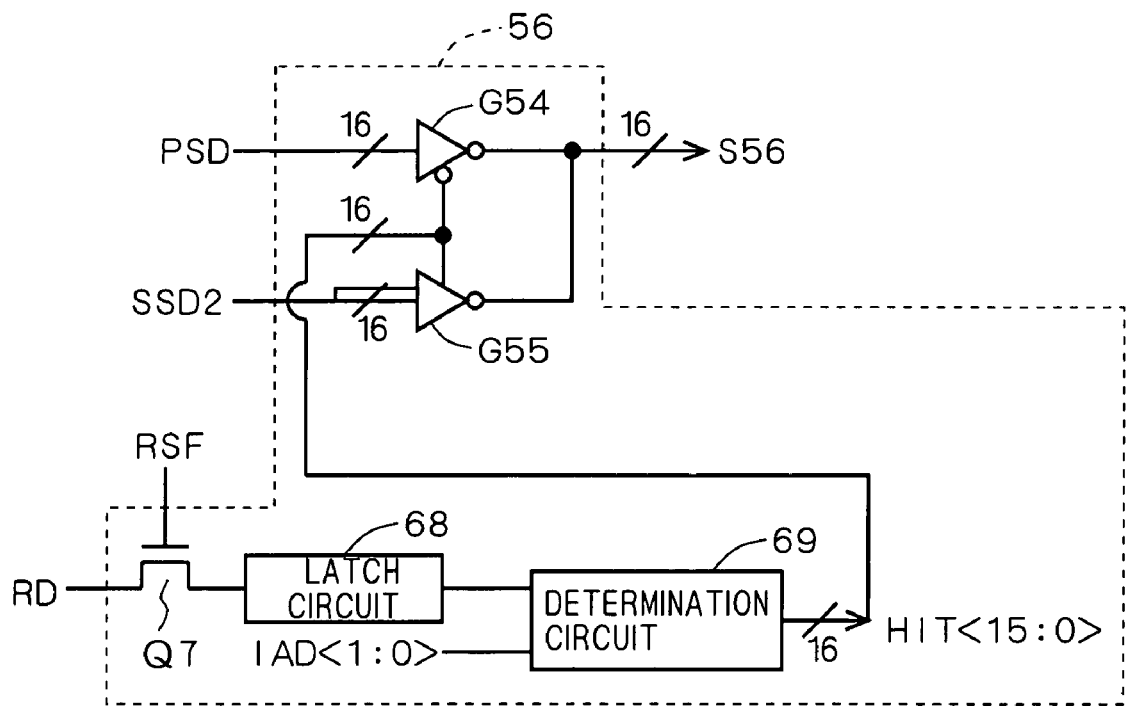
FIG. 21 is a circuit diagram showing the internal structure of a swap circuit shown in FIG. 19.

FIG. 21 is a circuit diagram showing the internal structure of the swap circuit 56. As shown, an inverter G54 (there are actually 16 of them, and one of them is typically illustrated) receives the page selection data PSD, and an inverter G55 (there are actually 16 of them, and one of them is typically illustrated) receives the spare data SSD2. That is, the 16 inverters G55 all receive the same spare data SSD2.

On the other hand, a latch 68 receives the redundant replacement information RD via an NMOS transistor Q7 (there are actually 6 of them, and one of them is typically illustrated). The redundant replacement information RD is 6-bit information including 2 bits of address replacement information RA <1:0> and 4 bits of redundant replacement information RD <3:0>, and is fetched into the latch 68 when the NMOS transistor Q7 is in the ON state.

The NMOS transistor Q7 has a gate for receiving the redundant information shift signal RSF. Accordingly, the redundant replacement information RD is fetched into the latch 68 when the redundant information shift signal RSF is "H". A determination circuit 69 receives the output of the latch 68 and the internal address IAD <1:0> to output a replacement signal HIT <15:0>.

The replacement signal HIT <15:0> is supplied to the reverse control inputs and control inputs of the 16 inverters G54 and G55. The replacement signal HIT <15:0> is usually "0" in all bits, and becomes "1" only in prescribed bits when replacement is required.

Accordingly, under normal conditions, the page selection data PSD is output as the replaced page selection data S56 without being processed, and when replacement takes place, data obtained by replacing the prescribed bits designated by the replacement signal HIT <15:0> in the page selection data PSD by the spare data SSD2 is output as the replaced page selection data S56.

Figure 22:
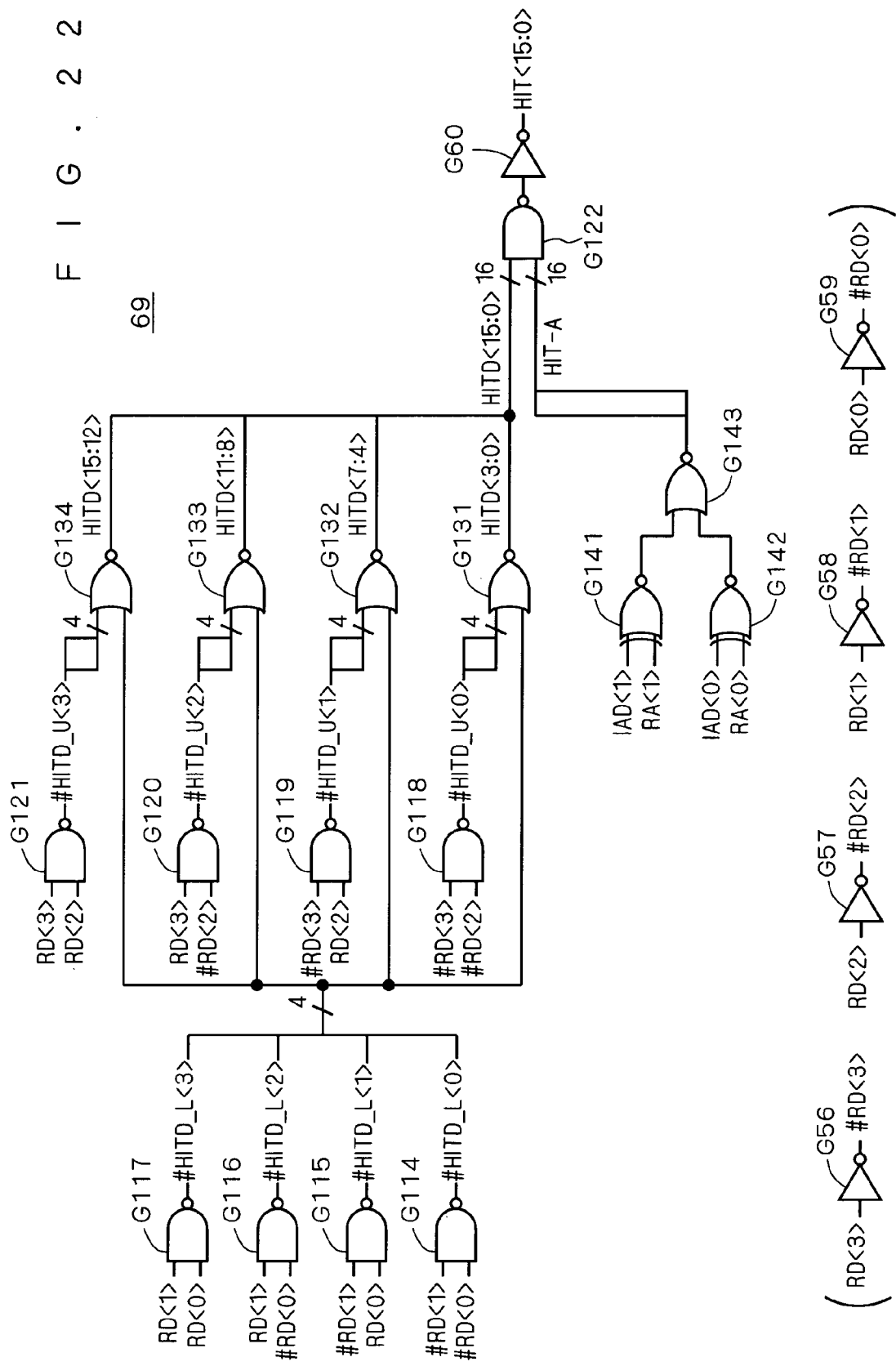
FIG. 22 is a circuit diagram showing the internal structure of a judgment circuit shown in FIG. 21.

FIG. 22 is a circuit diagram showing the internal structure of the judgment circuit 69. As shown, the redundant replacement information RD <3:0> is reversed by inverters G56 to G59 respectively, to obtain reverse redundant replacement information #RD <3:0>.

A NAND gate G114 has one and the other inputs for receiving the reverse redundant replacement information #RD <0> and the reverse redundant replacement information #RD <1> respectively. A NAND gate G115 has one and the other inputs for receiving the redundant replacement information RD <0> and the reverse redundant replacement information #RD <1> respectively. A NAND gate G116 has one and the other inputs for receiving the reverse redundant replacement information #RD <0> and the redundant replacement information RD <1> respectively. A NAND gate G117 has one and the other inputs for receiving the redundant replacement information RD <0> and the redundant replacement information RD <1> respectively.

A NAND gate G118 has one and the other inputs for receiving the reverse redundant replacement information #RD <2> and the reverse redundant replacement information #RD <3> respectively. A NAND gate G119 has one and the other inputs for receiving the redundant replacement information RD <2> and the reverse redundant replacement information #RD <3> respectively. A NAND gate G120 has one and the other inputs for receiving the reverse redundant replacement information #RD <2> and the redundant replacement information RD <3> respectively. A NAND gate G121 has one and the other inputs for receiving the redundant replacement information RD <2> and the redundant replacement information RD <3> respectively.

There are actually four NOR gates G131 to G134 provided, but one of each gate is typically illustrated for the sake of explanation. A hit detection signal #HITD_L <3:0> which is the output of the NAND gates G114 to G117 is input simultaneously to the one input of each of the NOR gates G131 to G134.

The NOR gate G131 has the other input for simultaneously receiving 4 bits of hit detection signal #HITD_U <0> which is the output of the NAND gate G118, the NOR gate G132 has the other input for simultaneously receiving 4 bits of hit detection signal #HITD_U <1> which is the output of the NAND gate G119, the NOR gate G133 has the other input for simultaneously receiving 4 bits of hit detection signal #HITD_U <2> which is the output of the NAND gate G120, and the NOR gate G134 has the other input for simultaneously receiving 4 bits of hit detection signal #HITD_U <3> which is the output of the NAND gate G121.

The result is that a replacement signal for detection HITD <15:0> (HITD <15:12>, HITD <11:8>, HITD <7:4>, HITD <3:0>) in which only 1 bit defined by the redundant replacement information RD <3:0> is turned to "1" is obtained as the outputs of the NOR gates G131 to G134.

On the other hand, an exclusive OR gate G141 has one input for receiving the internal address IAD <1> and the other input for receiving the address replacement information RA <1>, and an exclusive OR gate G142 has one input for receiving the internal address IAD <0> and the other input for receiving the address replacement information RA <0>. A NOR gate G143 has one and the other inputs for receiving the outputs of the exclusive OR gates 141 and 142 respectively.

The result is that the NOR gate G143 outputs a replacement address signal HIT_A of "H" only when the address replacement information RA <1:0> and the internal address IAD <1:0> match completely. The replacement address signal HIT_A is expanded to 16 bits to correspond to the replacement signal for detection HITD <15:0>.

A NAND gate G122 (there are actually 16 of them, and one of them is typically illustrated) receives the replacement signal for detection HITD <15:0> and the replacement address signal HIT_A. An inverter G60 (there are actually 16 of them, and one of them is typically illustrated) receives the output of the NAND gate G122, and outputs the replacement signal HIT <15:0>.

Therefore, when the internal address IAD <1:0> matches the address replacement information RA <1:0>, the replacement signal HIT <15:0> becomes "1" only in prescribed bits in order to replace the bits designated by the redundant replacement information RD <3:0>.

Figure 23:
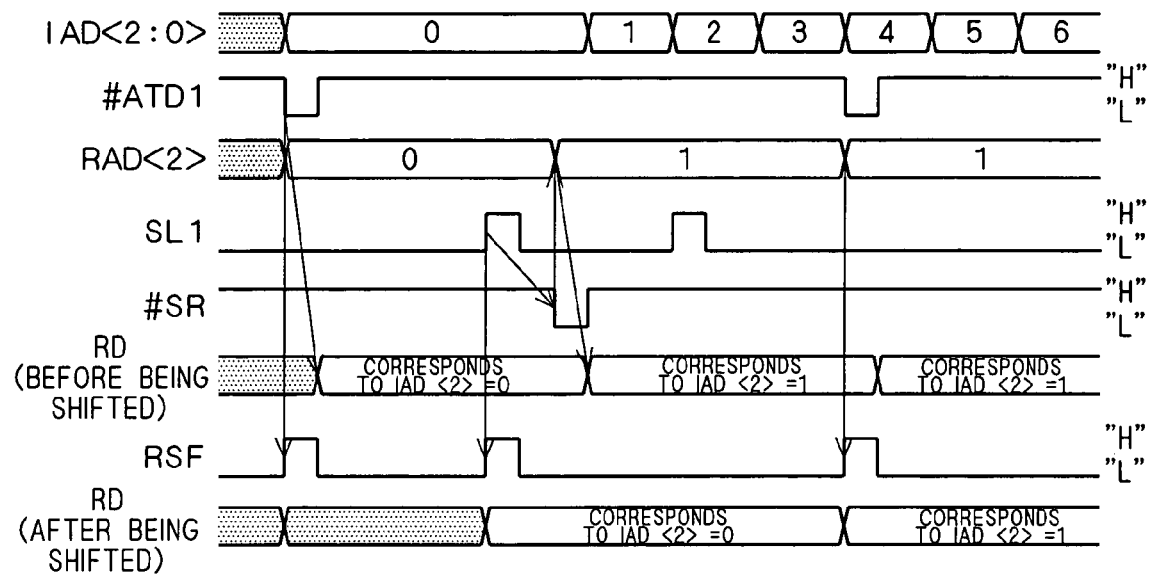
FIG. 23 is a timing diagram illustrating the redundant replacement operation by the swap circuit.

FIG. 23 is a timing diagram illustrating the redundant replacement operation by the swap circuit 56. As the spare control circuit 20 generates the spare Y selection signal SSY and the redundant replacement information RD based on the reversal process address RAD <2> as discussed above, it is required that the redundant replacement information RD be recognized properly in the swap circuit 56.

To that end, after the determination of the redundant replacement information RD, by effecting an "H" rise of the redundant information shift signal RSF prior to an "L" fall of the reversal indication signal #SR, the redundant replacement information RD after being shifted that is stored in the latch 68 always corresponds contents-wise to the page selection data PSD, as shown. For example, with a change to "1" of the reversal process address RAD <2>, the redundant replacement information RD (before being shifted) changes contents-wise to correspond to the internal address IAD <2>=1, however, the redundant replacement information RD (after being shifted) remains contents-wise to correspond to the internal address IAD <2>=0 until after the redundant information shift signal RSF rises to "H" the next time. Therefore, the information corresponding to the internal address IAD <2>=0 remains being latched into the latch 68 while the internal address IAD <2:0> changes from "0" to "3".

Figure 24:
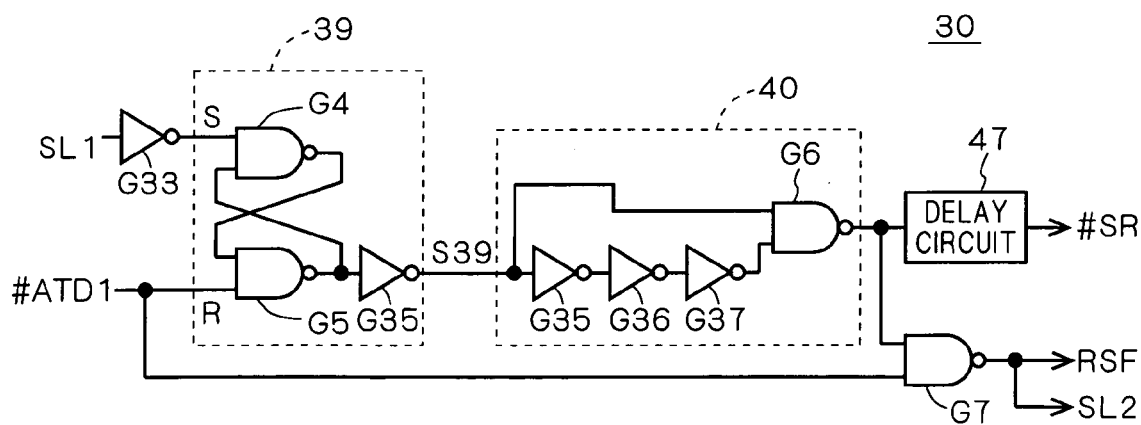
FIG. 24 is a circuit diagram illustrating an exemplary address reversal control circuit used in the third preferred embodiment.

FIG. 24 is a circuit diagram illustrating an exemplary address reversal control circuit used in the third preferred embodiment. As shown, the reversal indication signal #SR is obtained as the output of the NAND gate G6 via the delay circuit 47, and the same signal as the latch signal SL2 is also output as the redundant information shift signal RSF. The other components are similar to those in the address reversal control circuit 15 in the page mode control circuit shown in FIG. 11, so an explanation thereof is omitted.

With the address reversal control circuit 30 having the FIG. 24 structure, it is possible to effect an "H" rise of the redundant information shift signal RSF simultaneously with an "H" rise of the latch signal SL1, and effect an "L" fall of the reversal indication signal #SR with delay time T47 by the delay circuit 47 from an "H" rise of the latch signal SL1, as shown in FIG. 23.

In this manner, the semiconductor memory device according to the third preferred embodiment maintains the effective page mode reading function described in the first preferred embodiment, and further offers a redundant replacement function.

Moreover, by effecting an "H" rise of the redundant information shift signal RSF prior to an "L" fall of the reversal indication signal #SR by the address reversal control circuit 30, the redundant replacement information RD that is always proper contents-wise is latched into the latch 68 in the swap circuit 56 even with a reversal process of the reversal process address RAD <2>, allowing the redundant replacement operation to be performed properly.

The semiconductor memory device having a redundant data replacement function in addition to the first preferred embodiment structure is illustrated in this embodiment. Likewise, the redundant data replacement function may be added to the second preferred embodiment structure.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory device comprising:
   a memory cell array including a plurality of memory cells which are provided correspondingly to an address signal that consists of high order and low order address signals designated by first and second bit numbers;
   a read control part reading a prescribed number of memory cell information from said memory cell array based on said high order address signal;
   a sense amplifier performing a sense amplifying operation on each of said prescribed number of memory cell information to obtain a prescribed bit number of sense data;
   a latch for sense data latching said prescribed bit number of sense data at timing indicated by a first latch signal;
   a latch for page data latching said prescribed bit number of sense data stored in said latch for sense data as page data at timing indicated by a second latch signal, said page data being classifiable under n partial page data correspondingly to said low order address signal;
   a page mode control circuit outputting said first and second latch signals; and
   a selector circuit outputting said n partial page data as page selection data sequentially based on said low order address signal that changes n times during a page mode reading period, said page selection data being output as external data,
   after a first memory cell information group which is said prescribed number of memory cell information read from said memory cell array based on said high order address signal that defines a first address is latched into said latch for page data as said page data via said sense amplifier and said latch for sense data, said page mode control circuit performing a bit reversal process reversing prescribed bits in said first address defined by said high order address signal to generate a second address successive to said first address,
   during said page mode reading period based on said first memory cell information group, said page mode control circuit storing a second memory cell information group which is said prescribed number of memory cell information read from said memory cell array based on said high order address signal that defines said second address in said latch for sense data as said prescribed bit number of sense data via said sense amplifier, and
   after said page mode reading period based on said first memory cell information group has elapsed, said page mode control circuit latching said prescribed bit number of sense data based on said second memory cell information group stored in said latch for sense data into said latch for page data as said page data, thereby setting a page mode reading period based on said second memory cell information group after said page mode reading period based on said first memory cell information group.

2. The semiconductor memory device according to claim 1, wherein
   said page mode control circuit includes an address transition detection section detecting a transition of said high order address signal,
   said address transition detection section including:
   a first ATD circuit detecting a first address transition of said high order address signal to output a first address transition detection signal;
   a second ATD circuit detecting a second address transition of a reversal process address signal corresponding to said prescribed bits in said high order address signal to output a second address transition detection signal; and
   address transition signal generating means outputting a third address transition detection signal indicating an address transition when either said first address transition detection signal indicates said first address transition or said second address transition detection signal indicates said second address transition,
   said page mode control circuit further including:
   a first signal control circuit generating a sense signal that activates said sense amplifier and said first latch signal, based on said third address transition detection signal; and
   a second signal control circuit generating said second latch signal based on said first address transition detection signal.

3. The semiconductor memory device according to claim 2, wherein
   said second signal control circuit further receives said first latch signal and, at the time of generation of a first latch timing indication by said first latch signal after said first address transition detection signal indicates said first address transition, further generates a reversal indication signal indicating said bit reversal process to be performed and generates said second latch signal indicating latch timing.

4. The semiconductor memory device according to claim 3, wherein
   said page mode control circuit includes an address latch circuit latching at least part of an external address signal as said high order address signal and supplying said high order address signal based on the latched contents to said memory cell array,
   said address latch circuit latching a non-reverse signal of part corresponding to prescribed bits in said external address signal as said prescribed bits in said high order address signal when said first address transition detection signal indicates said first address transition, and latching a reverse signal of said part corresponding to said prescribed bits as said prescribed bits when said reversal indication signal indicates said bit reversal process to be performed.

5. The semiconductor memory device according to claim 1, wherein
   said prescribed number of memory cell information each include multivalued information of ternary or more-valued information,
   said sense amplifier performs first to "m-th" ($\geq 2$) sense amplifying operations on each of said prescribed number of memory cell information to obtain first to "m-th" sense data of said prescribed number, said prescribed bit number including the bit number m times that of said prescribed number,
   said latch for sense data includes first to "m-th" latch parts for sense data, said first to "m-th" latch parts for sense data latching said first to "m-th" sense data of said prescribed number, respectively,
   said latch for page data includes first to "m-th" latch parts for page data, and said page data includes first to "m-th" page data, said first to "m-th" latch parts for page data latching said first to "m-th" sense data of said prescribed number as said first to "m-th" page data, and said first to "m-th" page data being classifiable under n first to "m-th" partial page data, and
   said selector circuit includes first to "m-th" selector circuits, said first to "m-th" selector circuits outputting said n first to "m-th" partial page data as first to "m-th" page selection data sequentially based on said low order address signal that changes n times during a page mode reading period, said page selection data including said first to "m-th" page selection data.

6. The semiconductor memory device according to claim 1, further comprising:
   a spare memory cell array including a plurality of spare memory cells;
   a spare read control part reading a prescribed spare number of spare information based on a first signal portion which is part of said high order address signal and a spare selection signal;
   a spare sense amplifier for replacement controlled simultaneously with said sense amplifier, performing a sense amplifying operation on each of said prescribed spare number of spare information to obtain a prescribed spare bit number of spare sense data;
   a spare sensing latch latching said prescribed spare bit number of spare sense data at timing indicated by said first latch signal;
   a latch for spare data latching said prescribed spare bit number of spare sense data stored in said spare sensing latch as spare data at timing indicated by said second latch signal;
   a spare control circuit generating said spare selection signal and redundant replacement including information based on part of said high order address signal that excludes said first signal portion and includes said prescribed bits, said redundant replacement including information including address replacement information corresponding to said low order address signal and redundant replacement information; and
   a replacement performing circuit performing a replacement determination process that determines whether to perform replacement based on a comparison result between said address replacement information of said redundant replacement including information and said low order address signal, to replace bits defined by said redundant replacement information in said page selection data by said spare data when performing replacement.

7. The semiconductor memory device according to claim 6, wherein
   said replacement performing circuit fetches said redundant replacement including information at timing based on a redundant replacement including information fetch control signal, and
   said page mode control circuit further includes a replacement information control function further outputting said redundant replacement including information fetch control signal indicating fetching prior to said bit determination process.

8. A semiconductor memory device comprising:
   a memory cell array including a plurality of memory cells which are provided correspondingly to an address signal that consists of high order and low order address signals designated by first and second bit numbers;
   a read control part reading a prescribed number of memory cell information from said memory cell array based on said high order address signal;
   a sense amplifier performing a sense amplifying operation on each of said prescribed number of memory cell information to obtain a prescribed bit number of sense data;
   a latch for sense data latching said prescribed bit number of sense data at timing indicated by a first latch signal;
   a latch for page data latching said prescribed bit number of sense data stored in said latch for sense data as page data at timing indicated by a second latch signal, said page data being classifiable under n partial page data correspondingly to said low order address signal;
   a page mode control circuit outputting said first and second latch signals; and
   a selector circuit outputting said n partial page data as page selection data sequentially based on said low order address signal that changes n times during a page mode reading period, said page selection data being output as external data, wherein
   said page mode control circuit includes an address transition detection section detecting a transition of said high order address signal,
   said address transition detection section including:
   a first ATD circuit detecting a first address transition of said high order address signal to output a first address transition detection signal;
   a second ATD circuit detecting a second address transition of a reversal process address signal of a bit reversal process corresponding to said prescribed bits in said high order address signal to output a second address transition detection signal; and
   address transition signal generating means outputting a third address transition detection signal indicating an address transition when either said first address transition detection signal indicates said first address transition or said second address transition detection signal indicates said second address transition,
   said page mode control circuit further including:
   a first signal control circuit generating a sense signal that activates said sense amplifier and said first latch signal based on said third address transition detection signal; and
   a second signal control circuit generating said second latch signal based on said first address transition detection signal,
   said second signal control circuit further receiving said first latch signal and, at the time of generation of a first latch timing indication by said first latch signal after said first address transition detection signal indicates said first address transition, further generating a reversal indication signal indicating said bit reversal process to be performed and generates said second latch signal indicating latch timing, said page mode control circuit including an address latch circuit latching at least part of an external address signal as said high order address signal and supplying said high order address signal based on the latched contents to said memory cell array, said address latch circuit latching a non-reverse signal of part corresponding to prescribed bits in said external address signal as said prescribed bits in said high order address signal when said first address transition detection signal indicates said first address transition, and latching a reverse signal of said part corresponding to said prescribed bits as said prescribed bits when said reversal indication signal indicates said bit reversal process to be performed.

* * * * *